US012720789B2

(12) United States Patent
Henriksen et al.

(10) Patent No.: US 12,720,789 B2
(45) Date of Patent: Aug. 25, 2026

(54) METHOD OF CONTROLLING CHARGE DOPING IN VAN DER WAALS HETEROSTRUCTURES

(71) Applicants: Washington University, St. Louis, MO (US); the Trustees of Boston College, Chestnut Hill, MA (US)

(72) Inventors: Erik Henriksen, St. Louis, MO (US); Jesse Balgley, St. Louis, MO (US); Kenneth S. Burch, Newton, MA (US); Yiping Wang, Brighton, MA (US)

(73) Assignees: Washington University, St. Louis, MO (US); the Trustees of Boston College, Chestnut Hill (MA)

( * ) Notice: Subject to any disclaimer, the term of this patent is extended or adjusted under 35 U.S.C. 154(b) by 928 days.

(21) Appl. No.: 17/811,934

(22) Filed: Jul. 12, 2022

(65) Prior Publication Data

US 2023/0011913 A1 Jan. 12, 2023

Related U.S. Application Data

(60) Provisional application No. 63/203,191, filed on Jul. 12, 2021.

(51) Int. Cl.

| | |
|---|---|
| ***H01L 29/778*** | (2006.01) |
| ***H10D 30/01*** | (2025.01) |
| ***H10D 30/47*** | (2025.01) |
| ***H10D 62/824*** | (2025.01) |
| ***H10D 62/85*** | (2025.01) |
| ***H10D 64/23*** | (2025.01) |

(52) U.S. Cl.

CPC ......... *H10D 30/475* (2025.01); *H10D 30/015* (2025.01); *H10D 62/824* (2025.01); *H10D 62/8503* (2025.01); *H10D 64/251* (2025.01)

(58) Field of Classification Search

CPC .. H10D 30/475; H10D 30/015; H10D 62/824; H10D 62/8503; H10D 64/251; H10D 62/80; H10D 62/882

See application file for complete search history.

(56) References Cited

U.S. PATENT DOCUMENTS

| | | | |
|---|---|---|---|
| 2,631,356 A | 3/1953 | Sparks et al. | |
| 9,964,846 B2 | 5/2018 | Geohegan et al. | |
| 9,972,799 B2 | 5/2018 | Hersam et al. | |
| 10,217,819 B2 | 2/2019 | Lee et al. | |
| 2017/0098716 A1* | 4/2017 | Li | H10D 62/80 |
| 2021/0234015 A1* | 7/2021 | Lee | H01L 21/0254 |

FOREIGN PATENT DOCUMENTS

| | | | |
|---|---|---|---|
| WO | WO 2019/075481 A1 * | 4/2019 | G11C 11/02 |

* cited by examiner

*Primary Examiner* — Cuong B Nguyen
(74) *Attorney, Agent, or Firm* — Armstrong Teasdale LLP

(57) ABSTRACT

The present disclosure is directed to controlling charge transfer in 2D materials. A charge-transfer controlled 2D device comprises a 2D active conducting material, a 2D charge transfer source material, and at least one overlapping portion wherein the 2D active conducting material overlaps the 2D charge transfer source material including at least one edge of the 2D charge transfer source material.

8 Claims, 32 Drawing Sheets
(30 of 32 Drawing Sheet(s) Filed in Color)

p ($10^{13}$ cm$^{-2}$)
4
3
2
1
0
-15
0
15
30
Twist Angle (°)

p ($10^{13}$ cm$^{-2}$)
6
4
2
0
Raman
Transport
DFT
MINT
D3
D1
D2
0°
30°
mlg/R
~5L
2L
AA
AB
1L
mlg/BN/R
AA
AB
blg/R

ρ (Ω / □)
170 150 130 110 90 70
1/B (T-1)
0.12 0.14 0.16
D/ε0 (V/nm)
+0.325
+0.175
+0.025
-0.125
-0.275 pSdH (1013 cm-2)
5 4 3 2 1 0
Vg (V)
-20 0 20 40 60 80
0 1 2

| Doping mechanism | $n_{max}$ ($10^{12}$ cm$^{-2}$) | $\mu(\sim n^*)$ (cm$^2$ V$^{-1}$ s$^{-1}$) | Ref. |
|---|---|---|---|
| $RuCl_3$ | -50 | 4900 | Present work |
| | -38 | 1015 | 31 |
| | -36 | 1900-6000 | 32 |
| Solid polymer electrolyte gating | -400 | 2000 | 33 |
| | ±25 | 1500 | 34 |
| | +60 | N/A | 35 |
| | -30; +40 | N/A | 7 |
| | ±25 | N/A | 36 |
| Ionic liquid gating | ±50 | 30 | 37 |
| | -4; +7 | N/A | 38 |
| | -60 | N/A | 10 |
| STO gating | -7; +11 | N/A | 39 |
| $FeCl_3$ interc. | -580 | N/A | 40 |
| $KC_8$ interc. | +134 | N/A | 41 |
| Osmium adsorp. | -16 | N/A | 42 |
| Tungsten adsorp. | +6 | N/A | 43 |
| Indium adsorp. | +4.5 | N/A | 44 |
| Ca + K adsorp. | +165 | N/A | 45 |
| Chlorine func. | +15 | N/A | 46 |

FIG. 13

| Sample | $p$ ($10^{12}$ cm$^{-2}$) | Method |
|---|---|---|
| mlg/$RuCl_3$ (D1) | 29.23 | Raman |
| mlg/$RuCl_3$ (D2) | 31.37 | Raman |
| mlg/$RuCl_3$ (D3) | 22.21 | Raman |
| mlg/$RuCl_3$ (D5) | 41.60 | Transport |
| mlg/$RuCl_3$ | 39.29 | DFT |
| mlg/$RuCl_3$ (0°) | 30.20 | MINT |
| mlg/$RuCl_3$ (30°) | 24.47 | MINT |
| mlg/hBN/$RuCl_3$ (~5L hBN) (D3) | 6.02 | Raman |
| mlg/hBN/$RuCl_3$ (1L hBN) | 23.75 | DFT |
| mlg/hBN/$RuCl_3$ (2L hBN AA) | 18.15 | DFT |
| mlg/hBN/$RuCl_3$ (2L hBN AB) | 16.15 | DFT |
| blg/$RuCl_3$ (D2) | 59.17 | Raman |
| blg/$RuCl_3$ (AA) | 44.185 | DFT |
| blg/$RuCl_3$ (AB) | 40.492 | DFT |

FIG. 14

D1
g
mod
V
V
V
10 μm

Cr/Au
hBN
graphene
$AlO_x$
$RuCl_3$ $E_F$
d

â
b̂
ĉ
s0
RuCl3
g
distance along â (nm)
Δρavg (10-6 e/a.u.3)
80
40
0
-40
0
1
2
3

METHOD OF CONTROLLING CHARGE DOPING IN VAN DER WAALS HETEROSTRUCTURES

CROSS-REFERENCE TO RELATED APPLICATIONS

This application claims the benefit of priority to U.S. Provisional Patent Application No. 63/203,191 filed Jul. 12, 2021, which is incorporated by reference herein in its entirety.

STATEMENT REGARDING FEDERALLY SPONSORED RESEARCH & DEVELOPMENT

This invention was made with government support under DMR-1810305 and DMR-2003343 awarded by the National Science Foundation and N00014-20-1-2308 awarded by the Office of Naval Research. The government has certain rights in the invention.

FIELD OF THE DISCLOSURE

The field of the disclosure relates generally to using one 2D/layered crystalline material to donate/remove electrons from another 2D/layered crystalline material. The field of the disclosure relates specifically to novel methods of locally adding electrical charge to atomically thin (2D) materials, and more specifically to adding local electrical charge by layering flakes of a charge transfer material in atomically thin graphene devices, such as by layering flakes of α-$RuCl_3$ on top of an atomically thin graphene device. Advantages of this novel method include generation of atomically sharp p-n junctions.

BACKGROUND OF THE DISCLOSURE

Modulation doping in crystalline films produces extreme carrier mobilities for fast/high power electronics, efficient optoelectronics, qubits, the fractional quantum Hall effect, and topological superconductivity. However, two-dimensional (2d) van der Waals materials lack crystalline dopants for permanent, large, uniform, and local control of charge densities. Previous attempts utilized ionic liquid and polymer electrolyte gating, atomic/molecular intercalation, functionalization, and adsorption. Densities exceeding $10^{14}$ $cm^{-2}$ were achieved in graphene, though at significant cost to sample quality. Furthermore, these chemical approaches cannot be applied to air sensitive materials nor specific layers of the heterostructure.

Accordingly, there is a need for local addition of electric charge to atomically thin graphene devices and to gain control of the flow of electrical current through atomically thin materials for applications including but not limited to photovoltaics and computing. As shown herein, these limitations are circumvented with an insulating two-dimensional material that acts as a crystalline acceptor.

BRIEF DESCRIPTION OF THE DISCLOSURE

In one aspect, the present disclosure is directed to a charge-transfer controlled 2D device comprising a 2D active conducting material, a 2D charge transfer source material, and at least one overlapping portion wherein the 2D active conducting material overlaps the 2D charge transfer source material including at least one edge of the 2D charge transfer source material.

In another aspect, the present disclosure is directed to a method for controlling charge transfer in 2D materials, comprising providing a 2D active conducting material, providing a 2D charge transfer source material, and positioning the 2D active conducting material to overlap at least one portion of the 2D charge transfer source material including at least one edge of the 2D charge transfer source material.

In yet another aspect, the present disclosure is directed to a charge-transfer controlled 2D system comprising a top gate, a charge-transfer controlled 2D device, and a bottom gate. The charge-transfer controlled 2D device includes a 2D active conducting material, a 2D charge transfer source material, and at least one overlapping portion wherein the 2D active conducting material overlaps the 2D charge transfer source material including at least one edge of the 2D charge transfer source material.

In some aspects, the at least one overlapping portion includes the 2D active conducting material being in direct contact with the 2D charge transfer source material. In some aspects, the device further comprises an insulating layer such that the at least one overlapping portion comprises the insulating layer disposed between the 2D active conducting material and the 2D charge transfer source material. In some aspects, the 2D active conducting material is selected from graphene, $WSe_2$, and EuS. In some aspects, the 2D charge transfer source material is a crystalline and/or an exfoliated material. In some embodiments, the 2D charge transfer source material is selected from alpha-$RuCl_3$ and tungsten oxyselenide. In some aspects, the insulating layer is selected from hexagonal boron nitride and AlOx. In some aspects, the top gate is selected from Cr/Au and hexagonal boron nitride-supported Cr/Au and the bottom gate includes $SiO_2$/p-Si.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The embodiments described herein may be better understood by referring to the following description in conjunction with the accompanying drawings.

FIG. 1(A-C) is an exemplary embodiment of charge transfer in α-$RuCl_3$ heterostructures in accordance with the present disclosure.

FIG. 2(A-F) is an exemplary embodiment of α-$RuCl_3$ heterostructure optical characterization in accordance with the present disclosure. FIG. 2F (bottom) shows gate voltage dependence of the photovoltage along the green linecut in the scanned photovoltage map, consistent with a p-p' lateral junction.

FIG. 3(A-E) is an exemplary embodiment of charge transfer homogeneity in accordance with the present disclosure. FIG. 3B, inset shows three representative Raman spectra from D1 with varying weights of shifted and unshifted peaks, showing the different homogeneity.

FIG. 4(A-D) is an exemplary embodiment of an α-$RuCl_3$ charge transfer summary in accordance with the present disclosure.

FIG. 5(A-C) is an exemplary embodiment of strain and doping separation in accordance with the present disclosure.

FIG. 6(A-D) is an exemplary embodiment of EuS/$RuCl_3$ heterostructure characterization in accordance with the present disclosure. FIG. 6A shows temperature dependent DC moment of EuS/$RuCl_3$ heterostructure. The dash line is the Neel temperature of α-$RuCl_3$, the dot line is the Tc of EuS. FIG. 6B shows a zoomed-in view of FIG. 6A. FIG. 6C shows field dependent DC moment at 2K of EuS/$RuCl_3$ heterostructures. FIG. 6D shows Raman spectra of EuS,α-$RuCl_3$ and EuS/$RuCl_3$ heterostructures.

FIG. 7(A-B) is an exemplary embodiment of $WSe_2$/$RuCl_3$ heterostructure characterization in accordance with the present disclosure.

FIG. 9(A-B) is an exemplary embodiment of photovoltage measurements of mlg/$RuCl_3$ in accordance with the present disclosure.

FIG. 13 is an exemplary embodiment of graphene charge densities in accordance with the present disclosure. Maximum achieved graphene charge densities $n_{max}$ reported for different doping mechanisms, including α-$RuCl_3$ heterostructures, solid polymer electrolyte gating, ionic liquid gating, gating through an $SrTiO_3$ (STO) dielectric, and various atomic or molecular intercalation, adsorption, and functionalization methods. Values of the mobility μ at $n^*=30\pm5\times10^{12}$ $cm^{-1}$ are also listed where available.

FIG. 14 is an exemplary embodiment of experimentally measured and theoretically calculated densities for different graphene/$RuCl_3$ heterostructures in accordance with the present disclosure.

FIG. 16(A-E) is an exemplary embodiment of spatial control of modulation doping in graphene in accordance with the present disclosure.

FIG. 17(A-F) is an exemplary embodiment of resistance across a modulation-doping-defined p-n junction in accordance with the present disclosure.

FIG. 18(A-G) is an exemplary embodiment of STM and STS across step edges in graphene/hBN/α-$RuCl_3$ heterostructures in accordance with the present disclosure.

FIG. 19(A-E) is an exemplary embodiment of calculated charge densities of α-$RuCl_3$ ribbon on graphene in accordance with the present disclosure.

DETAILED DESCRIPTION OF THE DISCLOSURE

Figure 1A:
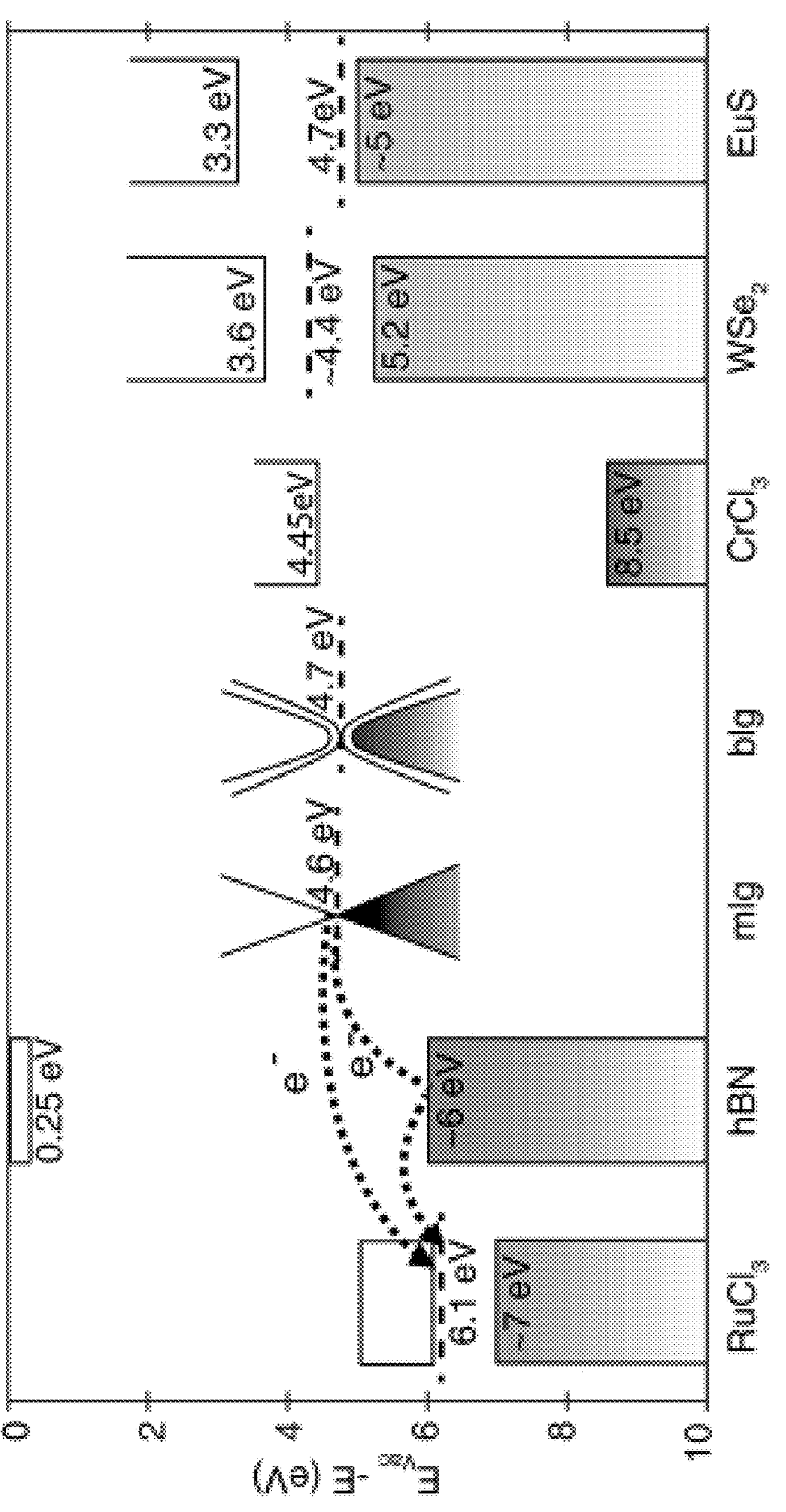
FIG. 1A shows a band alignment schematic; the work function difference between α-$RuCl_3$ and other compounds yields charge transfer.

Disclosed herein are new methods to controllably charge dope semiconductors and semimetals that exist in single- or few-layer flake forms. There is presently enormous interest in the field broadly known as "atomically thin materials" or "2D materials" which grew out of the discovery of graphene. Much activity focuses on the custom assembly of quasi-3D devices made by stacking single- and few-layer-flakes of materials chosen for their particular properties, in order to end up with a device with novel functionality. Such structures are commonly known as "van der Waals heterostructures." In some embodiments, flakes of α-$RuCl_3$ (which in bulk is a weak semiconductor at room temperature) are incorporated next to graphene, a large irreversible charge transfer occurs, with electrons moving from graphene to α-$RuCl_3$. The effect persists in a range of other 2D active conducting materials including but not limited to bilayer graphene, $WSe_2$ (a layered semiconductor), EuS (a magnetic semiconductor), and other atomically thin conducting materials. The effect yet persists when a thin insulating film is placed between the α-$RuCl_3$ and graphene, and in fact this embodiment operates as a method to control the magnitude of the charge transfer.

Also disclosed herein are ultra-sharp (≤10 nm) lateral p-n junctions in graphene using a combination of electronic transport, scanning tunneling microscopy, and first principles calculations. The p-n junction lies at the boundary between two differentially-doped regions of a monolayer graphene sheet, where one side is intrinsic and the other is charge-doped by close proximity to a flake of α-$RuCl_3$ across a thin insulating barrier. The p-n junction contribution to the device resistance is extracted, and used it to place bounds on the junction width. Whether the junction is ultra-sharp or not is correlated with the presence of a straight cleaved edge of the dopant α-$RuCl_3$ flake. That is, ultra-sharp junctions require the cleaved straight edge. Scanning tunneling spectroscopy in heterostructures of graphene, hexagonal boron nitride, and α-$RuCl_3$ shows potential variations on a sub-10 nm length scale. Density functional theory calculations reveal the charge-doping of graphene decays sharply over just nanometers away from the edge of the α-$RuCl_3$ flake.

Charge Doping Control in Van Der Waals Heterostructures

As described herein, doping is defined as adding impurities to a material that either donate or remove electrons from a semiconductor. "p" and "n" relate to removing or adding electrons. In materials, removing electrons leaves behind "holes", which behave exactly like electrons in that they can constitute a flow of electrical current; but they are positively charged, rather than negatively. p=positive, n=negative, describing the sign of the charge transferred. A p-n junction is at the heart of modern technology including diodes (current flows only one way), light-emitting diodes (e.g., modern computer screens), photovoltaics, and also transistors in every microchip. The primary issue is to have spatial control over the charge doping of the semiconductor. Moreover, the semiconductor industry needs new technology for when Si transistor minimum size is reached. One way forward is atomically-thin materials, such as but not limited to graphene, $WSe_2$, and EuS. Until the present disclosure, it was unknown how to controllably create a permanent charge doping (see FIG. 15A and FIG. 15B). That is, conventional methods typically require a voltage to be actively applied, and when the voltage is removed or changed, the charge doping changes or disappears. The methods of the present disclosure yield a permanent charge doping, independent of an applied voltage. As disclosed herein, placing one 2D material near another causes a transfer of charge, in which the spatial extent of charge-doping is controlled by the physical overlap of the two materials.

Figure 15A:
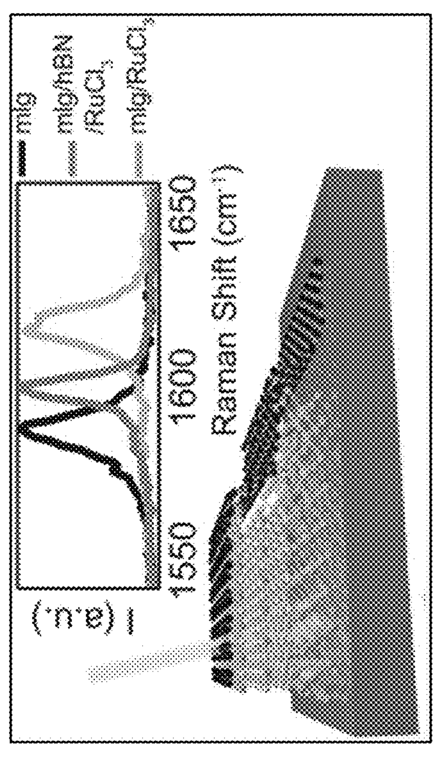
FIG. 15A and FIG. 15B are exemplary embodiments of profile views of example 2D devices in accordance with the present disclosure.
Figure 15A:
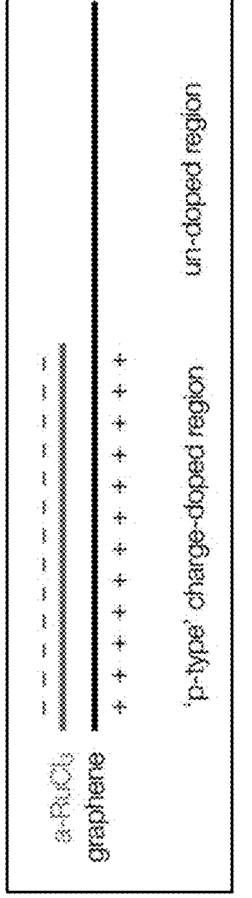
Figure 15A:
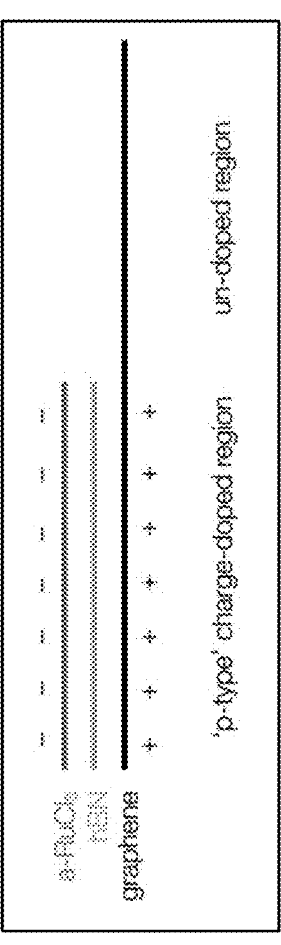
Figure 15A:
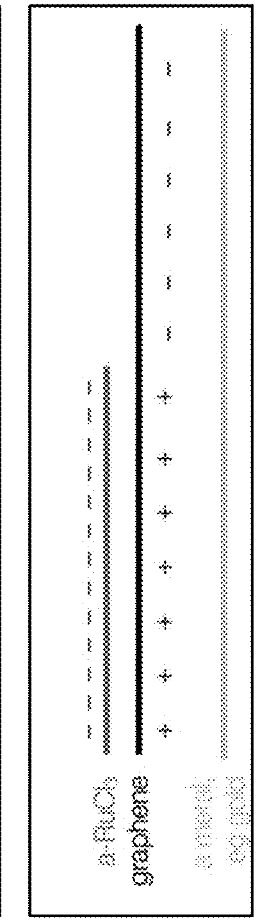

FIG. 15A shows that embodiments when α-$RuCl_3$ is in contact with graphene, the α-$RuCl_3$ removes electrons from graphene, leaving it with holes (indicated by '+' signs). The α-$RuCl_3$ is an extremely poor conductor (i.e., the α-$RuCl_3$ is insulating for all practical purposes) while the graphene is conducting. In embodiments when α-$RuCl_3$ is spaced away from graphene by an atomically-thin layer of 'hexagonal boron nitride' (hBN), the hBN is a crystalline insulator. While charge transfer still occurs, it is at a reduced level. The thicker the hBN (e.g., 1 layer or 2 layers, etc.), the lower the charge transfer. In some embodiments, a nearby piece of metal has a voltage applied to it, which forms a capacitor with the graphene, and can therefore change the charge density everywhere in the graphene. Such a metal is commonly called a "gate". The formerly "undoped" region now has a certain density of (−) charge carriers, making in 'n-type', while the density of carriers in the p-type region has been reduced. Accordingly, as disclosed herein, a p-n junction formed at the interface is ultra-sharp. By nature of its fabrication, the charge density of both the p and n type regions is tunable.

Figure 15B:
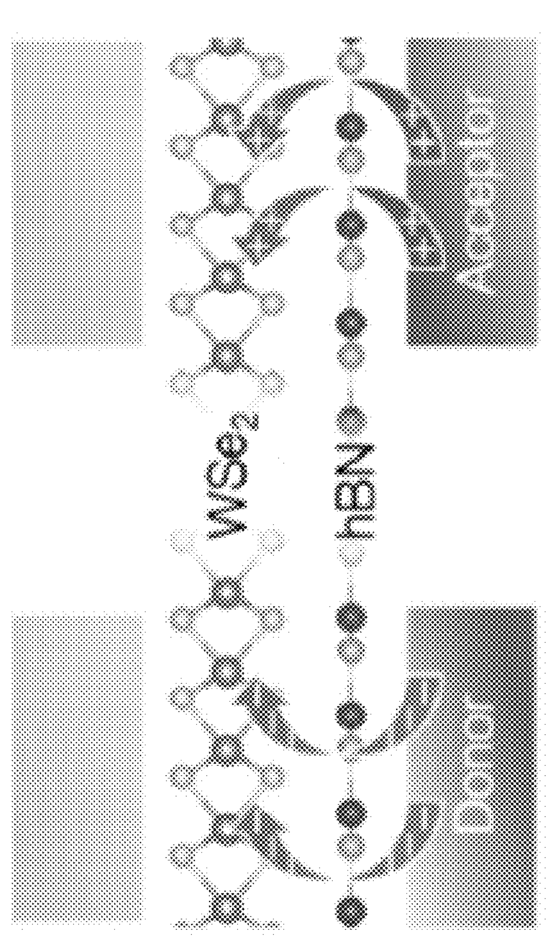
Figure 15B:
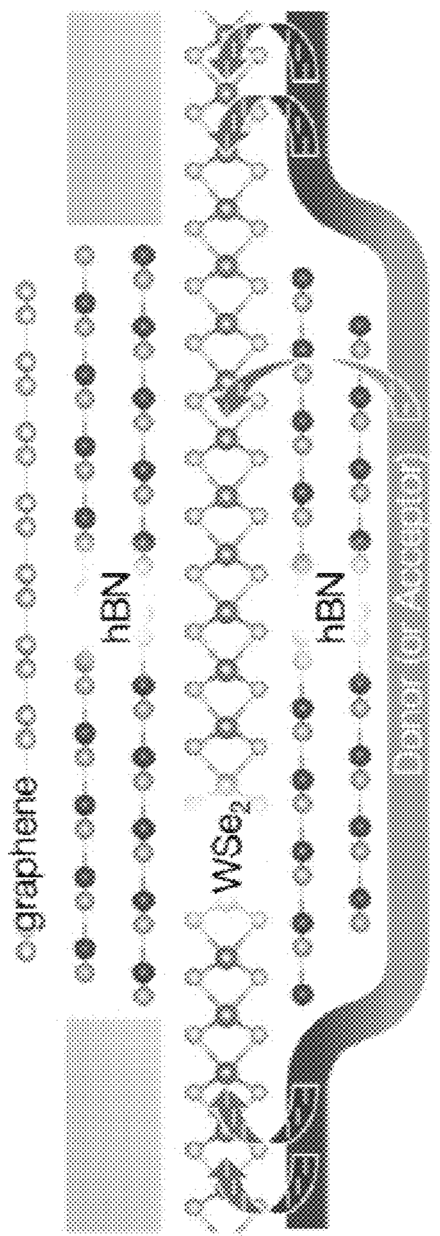

FIG. 15B (top) shows a p-n junction with $WSe_2$ as the active conducting region, material X dopes the $WSe_2$ to be n-type, while material Y dopes $WSe_2$ to be p-type, creating a very narrow p-n junction. The doped regions become highly conducting and are easily contacted by an added metal (gold-colored). The hBN plays the same role as in FIG. 14, e.g., it reduces the charge-doped density to a desired value. FIG. 15B (bottom) shows a more advanced device as a field-effect transistor (FET), made similarly to the p-n junction shown in FIG. 15B (top). Material Z is spaced from the $WSe_2$ by differing thicknesses of hBN. The hBN is thin at the right and left to make highly doped contact regions where the gold-colored metal is placed. The hBN is thicker in the central region, producing a lower charge density whose value is finally controlled by a voltage applied to the gate (e.g., a sheet of graphene).

New methods and new devices are disclosed herein. Making p-n junctions was the key technological breakthrough underlying transistor technology and hence microchips, computers, and the entire digital/hardware/software, and infrastructure built on that technology. This advance was the development of an ability to controllably charge-dope (meaning, to add or remove electrons) silicon and other semiconductors, which enabled the transistor-based technological revolution. The present disclosure provides the basis for recapitulating this advance in the novel field of atomically-thin materials. Accordingly, disclosed herein is for a technique to remove electrons from the target materials, including while still creating p-n junctions using electrostatic gating, which is a key technology not available in bulk semiconductors (like silicon) but which could theoretically work in 2D materials. Thus, the present disclosure achieved a laboratory demonstration of a p-n junction in graphene. While p-n junctions have been made previously, defining the two charge regions solely by electrostatic gating, this has disadvantages including impermanence of charge (it disappears or varies with the applied gate voltages), and the p-n junction itself is quite broad, and therefore not very technologically useful. As described herein, the p-n junction can be made almost atomically sharp, and data is consistent with such ultra-sharp p-n junctions. The ability to make p-n junctions, and to make them ultra-sharp, has great commercial relevance. The sharper the p-n junction, the stronger the in-plane electric field at the junction, which is critical for charge generation in photovoltaic and light-detection applications. It can also enable novel "electro-optic" applications by making "negative refraction" possible, extending many forefront optical ideas into the electronic realm. It enables precise control over the modulation of charge doping in graphene and other semiconductors, so that transistor-like elements can be readily defined with just a few layers of 2d materials stacked together as disclosed herein; and therefore may finally enable computing devices to be made of atomically thin materials.

In contrast to previous devices, the devices described herein comprise an active conducting layer/region that remains chemically identical the entire time, and by placing other materials nearby, a spatially localized/patterned charge transfer is effectively created without changing the chemical makeup of the active layer. Further, two regions are created in the same material with different charge states. In this way, the devices and methods described herein achieve a doped semiconductor material entirely of 2D materials.

In some embodiments herein, materials (such as alpha-$RuCl_3$) are used to remove/accept electrons in atomically thin 2D devices. Depending on the embodiment, the actively conducting region/layer (also called a target material) of the device is selected from graphene, $WSe_2$, EuS, and suitable alternatives such that two regions of separate charge are defined in the material and creates a p-n junction. In embodiments comprising graphene, additional application of an electrostatic gate voltage enables additional control over charge doping in either/both sides of the device. In some embodiments, the active layer/region comprises a material having a band gap or a semiconducting layered material which can be made in the atomically-thin limit. In embodiments comprising $WSe_2$ that is natively n-type, the charge transfer source (e.g., alpha-$RuCl_3$) creates a p-type region next to the $WSe_2$ making a monolithic p-n junction from solely these two materials. In other embodiments, materials are used that can donate electrons in order to give full control over device charge-doping profiles. In yet other embodiments, monolithic p-n junctions are created from three materials: one is the active region that currents flow through, the other two donate or remove electrons to change the charge state.

van der Waals heterostructures made by custom-stacking atomically thin materials together typically control charge by applying electric fields to the devices. In contrast, and as disclosed herein, adding layers of a material that serves as a source of charge transfer (including but not limited to alpha-$RuCl_3$, oxidized layers of $WSe_2$ known as tungsten oxyselenide, and other 2D charge transfer source materials) essentially soaks up a fixed amount of electrons, enabling permanent charge transfers that do not require the external electric field.

In exemplary embodiments described herein, alpha-$RuCl_3$ (known for its antiferromagnetic properties for quantum spin liquids) is readily able to transfer charge to several different types of materials including, though not limited to, graphene. Adding charge to a quantum spin liquid is one mechanism thought to underlie the physics of high-temperature superconductivity. In some embodiments, placement of a single layer of alpha-$RuCl_3$ on top of an atomically thin material/device successfully and sufficiently created and transferred charge. In some embodiments, placement of a thin sheet of an electrically insulating material between alpha-$RuCl_3$ and graphene is not detrimental to charge transfer within the device. In these embodiments, varying the thickness of the insulator controls how much charge flows in. Accordingly, the methods described herein effectively enable modulation doping (i.e., physical and spatial separation of the source of charge from where it goes). In typical heterostructures, atoms must be added to bulk materials, which causes lots of disorder. However, as disclosed herein, layering a source of charge transfer enables charge to flow right in, and there is no need to change the chemical structure of the device with bulk materials, thus making the methods described herein a 'clean' way to add charge.

Two-dimensional nanoelectronics, plasmonics, and emergent phases require clean and local charge control, calling for layered, crystalline acceptors or donors. As described herein, Raman, photovoltage, and electrical conductance measurements combined with ab initio calculations that establish the large work function and narrow bands of $\alpha$-$RuCl_3$ enable modulation doping of exfoliated (e.g. flaked) single and bilayer graphene, chemical vapor deposition grown graphene, $WSe_2$, molecular beam epitaxy grown EuS, and other 2D active conducting materials. Proof of principle is further demonstrated for photovoltage devices, control via twist angle, and charge transfer through hexagonal boron nitride. Short-ranged lateral doping (≤65 nm) and high homogeneity are achieved in proximate materials with a single layer of $\alpha$-$RuCl_3$. This leads to the best-reported monolayer graphene mobilities (4900 $cm^2$/(V s)) at these high hole densities ($3\times10^{13}$ $cm^{-2}$) and yields larger charge transfer to bilayer graphene ($6\times10^{13}$ $cm^{-2}$).

Exemplary embodiments of the present disclosure focus on $\alpha$-ruthenium(III) chloride ($\alpha$-$RuCl_3$), a van der Waals, narrow-band Mott insulator with a deep work function of 6.1 eV (FIG. 1(A-C)), far greater than the typical work functions of layered materials (~4.5 eV). In $\alpha$-$RuCl_3$ the onsite Coulomb repulsion (U) and strong spin-orbit coupling ($\lambda$SOC) produce strongly narrowed valence and conduction bands that are just 1 eV apart with the Fermi level close to the conduction band edge. Taken together, these properties imply $\alpha$-$RuCl_3$ will accept a large density of electrons. This electronic structure also makes $\alpha$-$RuCl_3$ a good insulator and thus is unlikely to interfere with electrical measurements. Further isolation is possible by using a hexagonal boron nitride (hBN) spacer, through which $\alpha$-$RuCl_3$ still draws charge. Additionally, this unique electronic structure produces complex magnetic interactions in $\alpha$-$RuCl_3$, placing it close to a Kitaev spin liquid phase. Thus, heterostructures enable novel magnetic states and incorporate the topological excitations of $\alpha$-$RuCl_3$ into devices. Lastly, for mid-IR plasmonic and optoelectronic applications, $\alpha$-$RuCl_3$ has minimal optical absorption below the 1 eV gap.

To establish $\alpha$-$RuCl_3$ as a crystalline acceptor and bring modulation doping to two-dimensional crystals, spatially resolved Raman spectroscopy was employed. This allows rapid probing of the induced charge, strain, homogeneity, lateral, and vertical extent of the charge transfer in a variety of $\alpha$-$RuCl_3$ heterostructures without fabrication. Results disclosed herein provide the first unambiguous evidence that even a single layer of $\alpha$-$RuCl_3$ is able to strongly charge the target layer even when hBN is between them, including higher doping in bilayer graphene. A variety of proof of principle experiments further point to its utility: creation of a p-p' homojunction for 2D optical sensors and electronics, and charge transfer to chemical vapor deposition-grown (CVD) graphene and $WSe_2$, as well as molecular beam epitaxy-grown EuS (see FIGS. 5(A-C) through 14). In the latter case, the effect on EuS delivered a four-orders-of-magnitude reduction of the measured resistance and an induced hole density of $6.5\times10^{13}$ $cm^{-2}$ predicted by ab initio "mismatched interface theory" (MINT). The combined Raman, transport, and MINT results also point to the ability to tune the charge transfer via twist angle with minimal induced strain, crucial for achieving clean modulation doping with short lateral extent (≤65 nm). This rather small length scale is consistent with theoretical calculations for the formation of p-n junctions in graphene due to mismatched work functions with metal contacts as well as recent near-field IR experiments. The short-range also requires careful optimization to minimize inhomogeneous charge transfer, which can be screened for using Raman spectroscopy, leading to clean devices with a single, highly doped conducting channel and the highest mobilities (4900 $cm^2$/(V s)) of graphene charged to a similar level.

Recently, electronic transport experiments and first-principles calculations also suggested $\alpha$-$RuCl_3$ can dope monolayer graphene (mlg) to hole densities of a few $10^{13}$ $cm^{-2}$. However, the two experiments also showed Dirac points close to zero gate voltage. Furthermore, the Hall and quantum oscillation data imply multiple carrier densities or a splitting of the Dirac cone. As shown through careful Raman studies, these features resulted from regions where the two materials do not touch. Indeed, since transport averages over the whole device it will include contributions from both the nearly charge neutral and strongly hole-doped regimes. Creating uniformly doped samples is crucial for eventual device functionality and, according to electronic structure calculations, will strongly affect the electronic properties of the combined system. Beyond disorder, the lateral and vertical extent of the charge transfer, dependence on layer number and relative rotation, ability to charge dope materials beyond mlg, and prototypical devices remain unexplored.

Figures 1B, 1C:
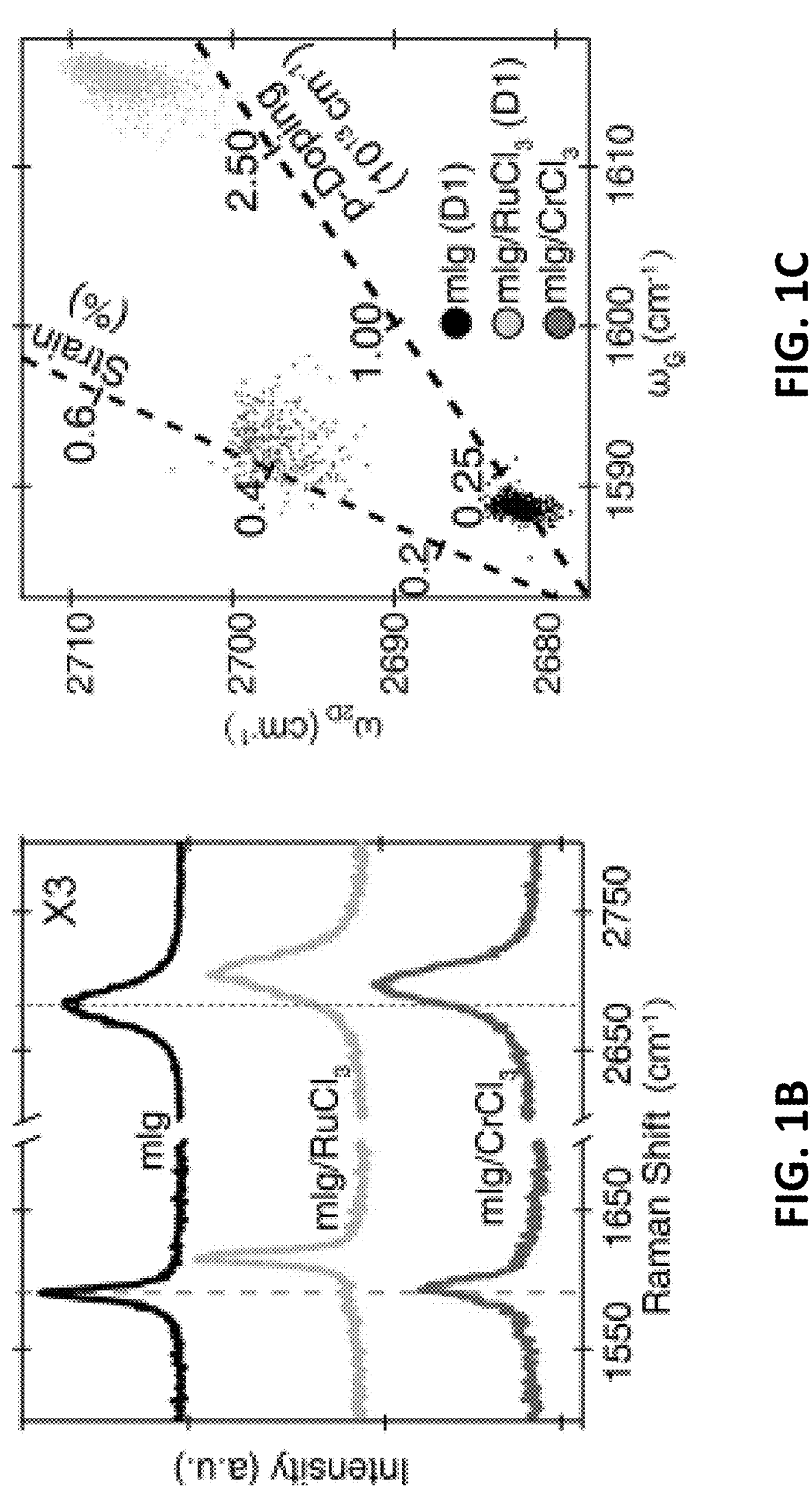
FIG. 1B shows representative Raman spectra for mlg (black trace), mlg/$RuCl_3$ (yellow trace), and mlg/$CrCl_3$ (green trace) samples.
FIG. 1C shows correlation between the graphene G and 2D Raman mode for different mlg-based heterostructures, result of only strain or doping indicated with dashed lines.

Device (D1) is a single monolayer graphene sheet laid across both mono- and bilayer $\alpha$-$RuCl_3$, all supported by a $SiO_2$/Si substrate. This and the other structures designed, constructed, and characterized herein represent a new class of devices, incorporating $\alpha$-$RuCl_3$- or hBN-supported graphene that either lack contacts or have etched contacts at the graphene edge. This ensures that the interface between graphene and $\alpha$-$RuCl_3$ is not affected by the presence of metallic leads. The room-temperature Raman spectra is shown in FIG. 1B for D1 of the pure mlg and mlg/$RuCl_3$ regions. In the former, G and 2D Raman peaks were observed whose positions ($\omega G^0$, $\omega 2D^0$)=(1581.6±0.2 $cm^{-1}$, 2676.9±0.7 $cm^{-1}$) lie within the range of accepted values for intrinsic graphene with small amounts of local strain and doping from the $SiO_2$ substrate. In clear contrast, in device regions containing graphene in contact with $\alpha$-$RuCl_3$, the G and 2D peaks are both significantly blue-shifted by 30 and 22 $cm^{-2}$, respectively, indicating sizable charge transfer.

Figures 2A, 2B, 2C:
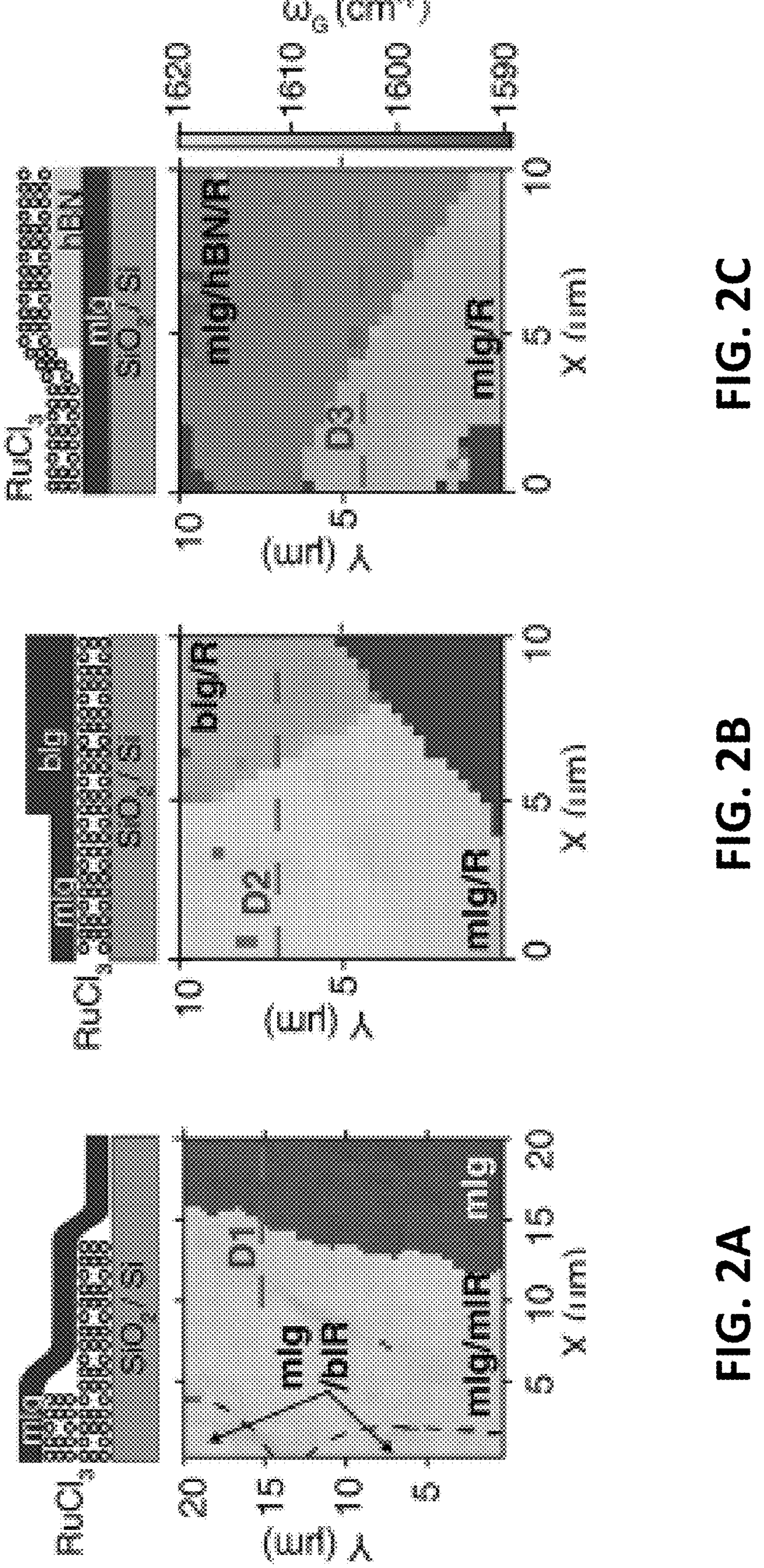
FIG. 2A, FIG. 2B, and FIG. 2C show Raman maps of the graphene G peak frequency for different α-$RuCl_3$ heterostructures with schematics of each heterostructure above their respective maps.

The doping and strain corresponding to the G and 2D peak shifts are determined following procedures described herein below. In FIG. 1C, the established calibrations for pure strain and doping are plotted along with the distributions of peak shifts for the pure mlg and mlg/$RuCl_3$ regions in D1, taken from a spatially resolved Raman map (FIG. 2A). The observed peak shifts in mlg/$RuCl_3$ indicate an induced average carrier density of ~$3\times10^{13}$ $cm^{-2}$, similar to previous reports and predictions. The charge density variations in each device are smaller than the differences between the average values. As discussed below, this is associated with the (uncontrolled) relative twist angle between the graphene and $\alpha$-$RuCl_3$. To determine the strain, it was assumed uniaxial since (i) MINT calculations indicate it is dominant, and (ii) this provides better agreement with experiment compared to a biaxial strain model (see FIGS. 5(A-C) through 14). No correlation is found between doping and strain with the latter being quite small (<0.2%).

To determine whether this charge transfer capability is unique to $\alpha$-$RuCl_3$ or is generic to all layered halides, devices were investigated incorporating $CrCl_3$, a magnetic semiconductor with a similar lattice structure to $\alpha$-$RuCl_3$. Density functional theory (DFT) calculations show the conduction band of $CrCl_3$ is quite close to the Dirac point of graphene (FIG. 1A), indicating it cannot drive a large charge transfer. As expected, the measured Raman spectra (FIG. 1B) together with a scatter plot of the peak positions (FIG. 1C) from a $SiO_2/CrCl_3$/mlg/hBN stack reveal shifts of the 2D peak alone, while the G peak remains essentially unchanged. Thus, $CrCl_3$ primarily produces a strain in the adjacent graphene layer, confirming that charge transfer is not a generic feature of layered halides.

Next the thickness dependence of the charge transfer between α-$RuCl_3$ and graphene layers was studied. First the spatially resolved map of the Raman G peak frequency for device D1 was studied, as shown in FIG. 2A, since this mode has the strongest dependence on the carrier density in mlg. Surprisingly, there is no noticeable change in the G peak frequency of graphene when the laser spot crosses from monolayer α-$RuCl_3$ to bilayer α-$RuCl_3$, indicating a single monolayer is sufficient to induce the large hole density.

Figures 4A, 4B:
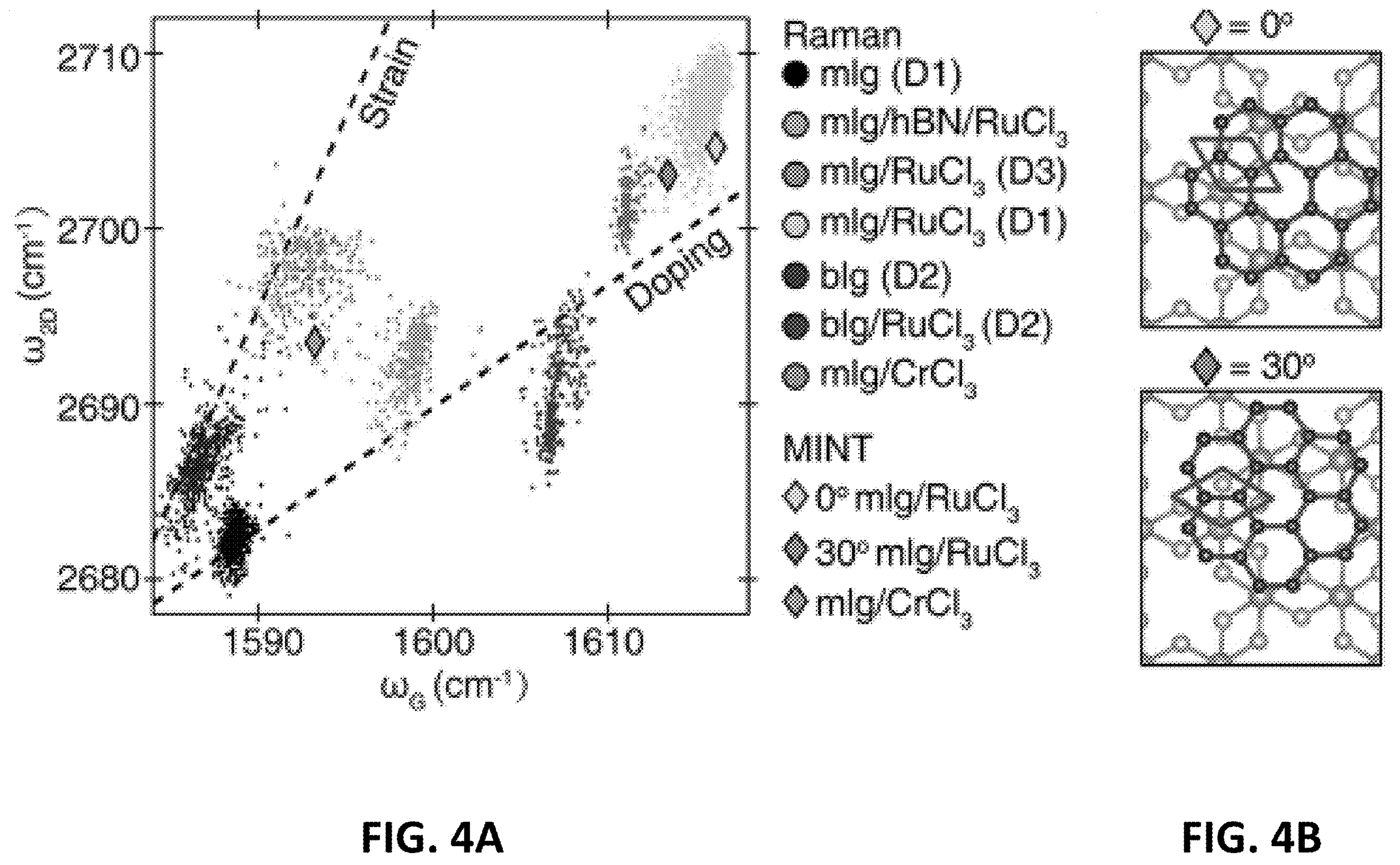
FIG. 4A shows correlation between the graphene G and 2D Raman mode for all samples discussed in the text (dots), as well as converted MINT results (diamonds) for different twist angles.
FIG. 4B shows representative MINT supercell alignments for 0° (top) and 30° (bottom) mlg/$RuCl_3$ twist angles.
Figures 4C, 4D:
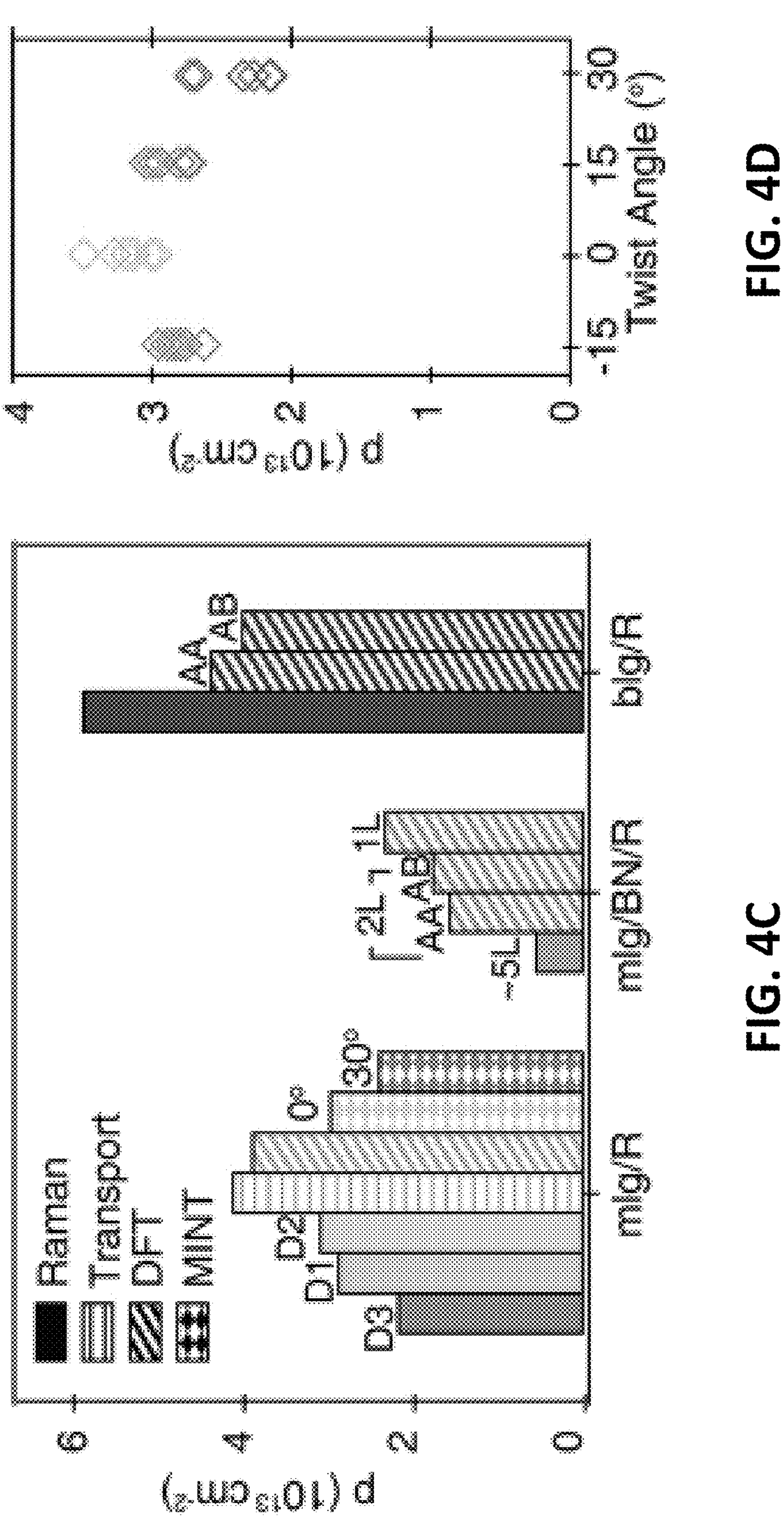
FIG. 4C shows doping levels calculated from Raman spectroscopy (filled bars), transport (horizontally striped bars), DFT (diagonally striped bars), and MINT (diamond-checkered bars).
FIG. 4D shows MINT-calculated mlg doping levels for six graphene supercell positions at different relative twist angles.

The same is not true for graphene, where it was found that bilayer is more heavily doped than mlg. Specifically, a heterostructure device (D2) was measured having contiguous mono- and bilayer graphene, each partially covering the same flake of α-$RuCl_3$ (see FIGS. 5(A-C) through 14). The G-peak frequency of the bilayer graphene (blg)/$RuCl_3$ and mlg/$RuCl_3$ regions in a map (FIG. 2B) and the G/2D distributions in FIG. 4A were compared. Both show the G and 2D peak shifts are smaller in blg/$RuCl_3$ than in mlg/$RuCl_3$. However, the density of states is larger in blg, and thus the G peak shift for the same carrier density will be less as it depends on the Fermi level. The resulting average carrier density in blg ($6\times10^{13}$ $cm^{-2}$) is higher than in mlg ($3\times10^{13}$ $cm^{-2}$). In tandem, self-consistent DFT calculations were performed (as described herein below) for blg/α-$RuCl_3$ implemented for AA- and AB-stacked blg. In both cases, a larger charge transfer was found from α-$RuCl_3$ into blg than mlg (FIG. 4C).

Inspired by traditional modulation doping that employs an intermediate insulating layer to separate donors/acceptors from the charged layer, a third device design was explored. Device D3 contains three regions of bare mlg, mlg and α-$RuCl_3$ in direct contact, as well as mlg and $RuCl_3$ separated by ≈3 nm-thick hBN. As the valence band maximum of hBN is closely aligned with the work function of α-$RuCl_3$ (FIG. 1A), the insulating barrier will reduce—but not entirely eliminate—charge transfer from the mlg. Indeed, the spatially resolved G peak map of D3 (FIG. 2C), along with the distribution of 2D and G peak positions (FIG. 4A), are consistent with the hBN spacer lowering the induced hole density in mlg to $0.6\times10^{13}$ $cm^{-2}$. DFT calculations of mlg/hBN/$RuCl_3$ heterostructures indicate this doping is tunable via an inverse relation between the charge transfer and the intermediate hBN thickness (FIG. 4C).

The G peak maps of devices D1, D2, and D3 all indicate the lateral charge transfer is short, changing abruptly across the α-$RuCl_3$ boundary. This is illustrated via the linecuts in FIG. 3E, which reveal the doping transition is shorter than the 0.3 μm scanning resolution. The potential utility of this sharp doping profile is demonstrated in room temperature photo-voltage measurements shown in FIG. 2F for device D4, a graphene channel partially covered with α-$RuCl_3$. The photovoltage map shows a clear photoresponse at the boundary of the $RuCl_3$ region, indicating the presence of a p-p' junction leading to a photovoltaic effect. The width of the response is consistent with the spot size of the laser (~1 μm) indicating a sharp doping profile. Photothermal effects were ruled out by testing both the polarization dependence (see FIGS. 5(A-C) through 14) and the minimal effect of a displacement field D (line scans in FIG. 3F). The response seen in graphene not covered by α-$RuCl_3$ is likely due to inhomogeneous local doping. Indeed, the photovoltage from the uncovered region is suppressed by D, whereas the α-$RuCl_3$ covered region response is insensitive to D. As such, these results show the potential of α-$RuCl_3$ in creating homo-junctions of different carrier densities for optoelectronic devices.

Similarly crucial is the homogeneity of the induced charge. Given the short lateral extent, regions where the α-$RuCl_3$ is not in good contact with graphene may have little to no induced charge, yielding a Raman spectra with both shifted and unshifted peaks, as shown by the spectra at three different locations of device D1 (inset of FIG. 3B). A combination of shifted and unshifted G peaks indicates the presence of both fully doped and charge neutral regions, which likely occurred in previously reported devices. This was confirmed by applying a gate voltage, which moved the center of the unshifted peaks, but not the shifted G peaks as they come from regions with large carrier density (see FIGS. 5(A-C) through 14). The relative size of each region within the laser spot is correlated to the spectral weight of the shifted and unshifted peaks with some spectra (yellow shaded trace in FIG. 3B inset) revealing no neutral regions. Whether unshifted peaks are present or not, the shifted peaks always appear at the same energy. This is consistent with extremely short-ranged lateral charge transfer, leading to undoped puddles within doped regions with nearly constant induced density. In some embodiments, if the chemical potential in α-$RuCl_3$ is spatially inhomogeneous, a corresponding distribution of doping in graphene is expected that is not seen in the G peak shifts.

Figures 2D, 2E, 2F:
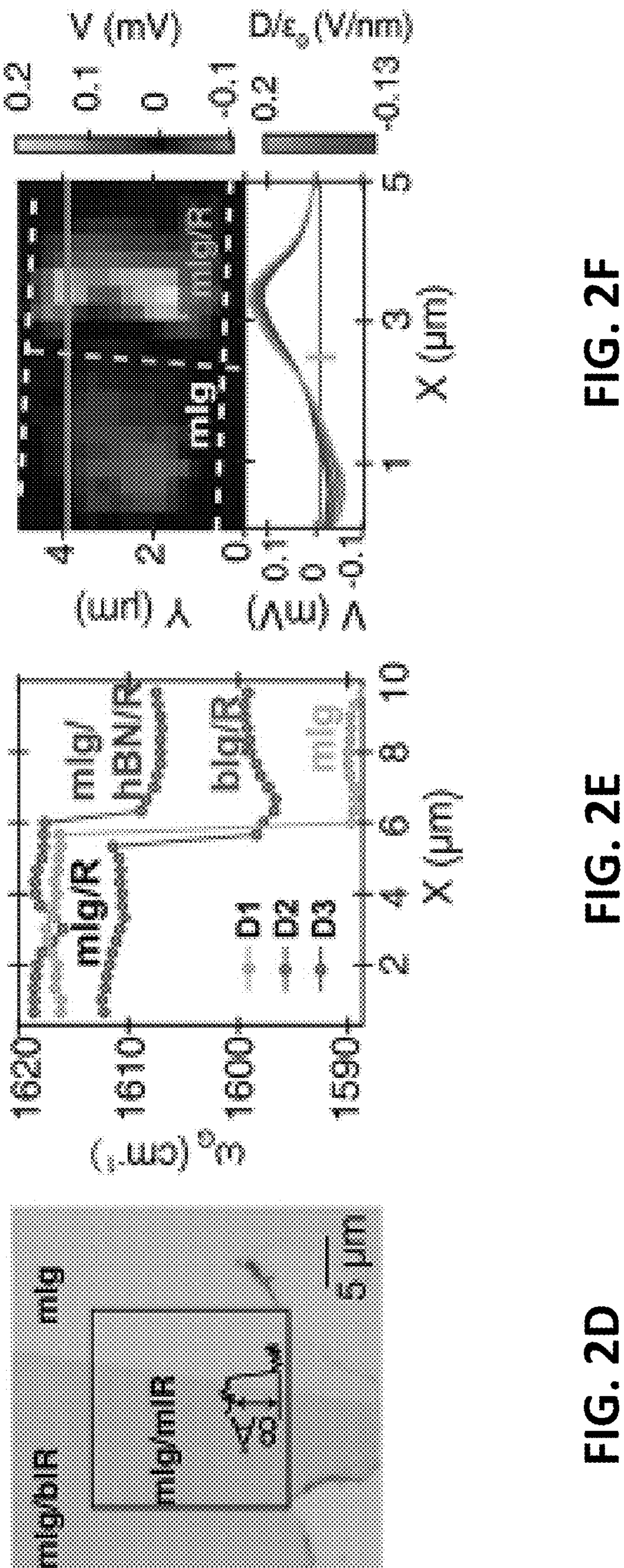
FIG. 2D shows false-color optical micrograph of D1, mlR is monolayer $RuCl_3$, blR is bilayer $RuCl_3$, and R means $RuCl_3$. Atomic force microscope of monolayer α-$RuCl_3$ step height (inset). The black square marks the area scanned in FIG. 2A.
FIG. 2E shows horizontal linecuts of the G peak frequency across the lines indicated in FIG. 2A, FIG. 2B, and FIG. 2C, revealing the sharp doping change.
FIG. 2F (top) shows a scanning photovoltage map of mlg/α-$RuCl_3$ heterostructure acquired at room temperature with a 532 nm laser. mlg is between the white dashed lines, while right of the orange dashed line is covered by α-$RuCl_3$.
Figures 3A, 3C:
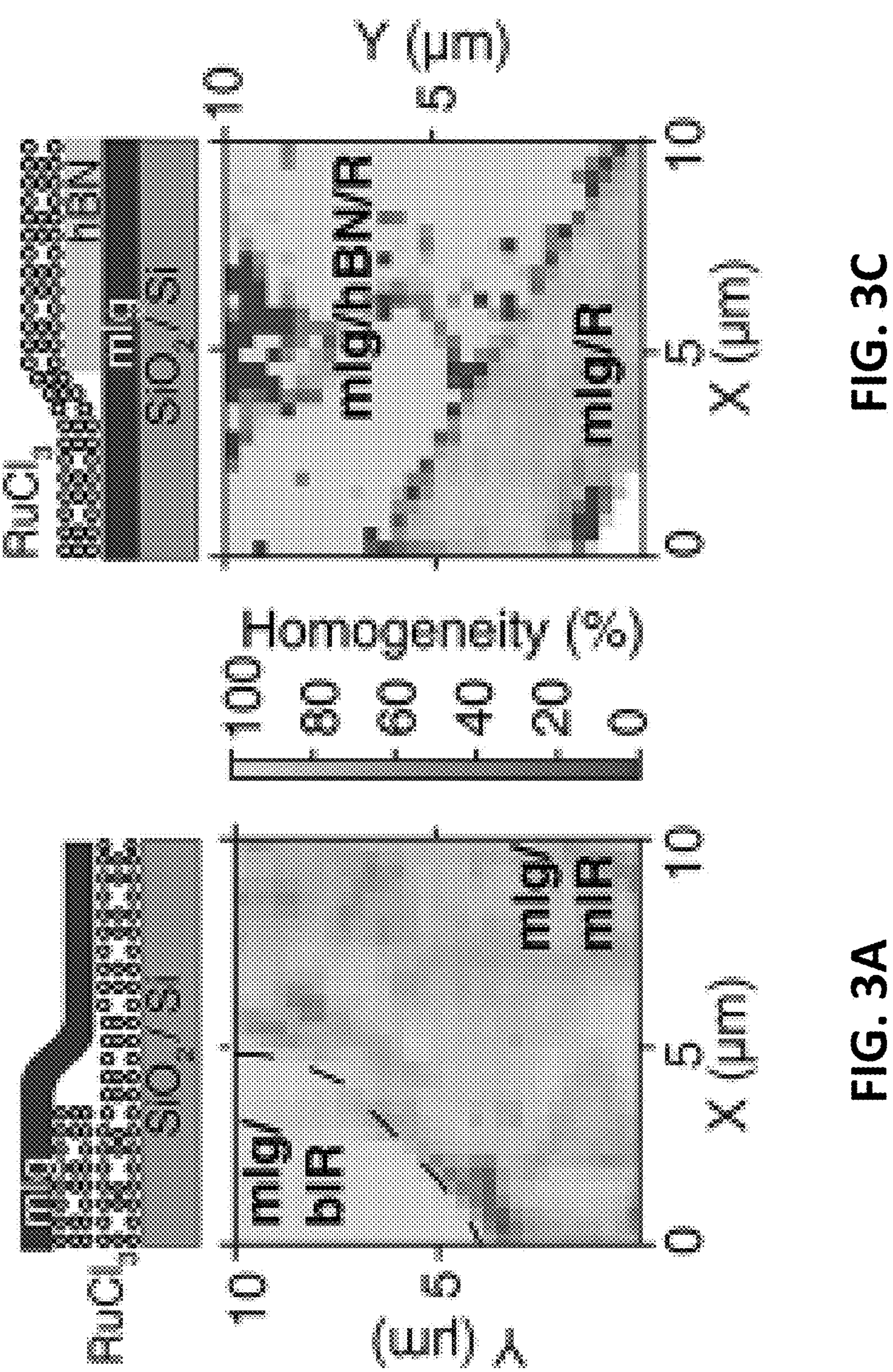
FIG. 3A and FIG. 3C show spatially resolved homogeneity maps for D1 and D3, respectively, with stacking schematics depicted above.

To quantify the uniformity, homogeneity was defined to be 100% when only a shifted G peak is present, whereas 0% homogeneous regions exhibit shifted and unshifted peaks with equal spectral weight. device homogeneity was then quantified as $(2\times I_{norm})-1$, where $I_{norm}$ is the intensity of the shifted G peak normalized by the sum of intensities of both peaks. The map of sample D1's homogeneity, shown in FIG. 3A, reveals a submicron spatial variation. Some regions were found with 95% homogeneity, indicative of neutral regions≤65 nm in radius, given the 300 nm resolution (FIG. 2E) (see FIGS. 5(A-C) through 14). The homogeneity improves for graphene in contact with bilayer versus monolayer α-$RuCl_3$ due to better mitigation of the surface roughness of the underlying $SiO_2$ substrate. Further consistency with the picture that the interface quality is crucial to uniform doping is provided by device D3 (FIG. 3C). Here, regions with atomically flat hBN showed improved homogeneity and also revealed in histograms of the homogeneity values for D1 and D3 (see FIG. 2B and FIG. 2D). These results imply that Raman spectroscopy can be used to prescreen samples, enabling the deterministic fabrication of clean and homogeneous devices.

Figure 3D:
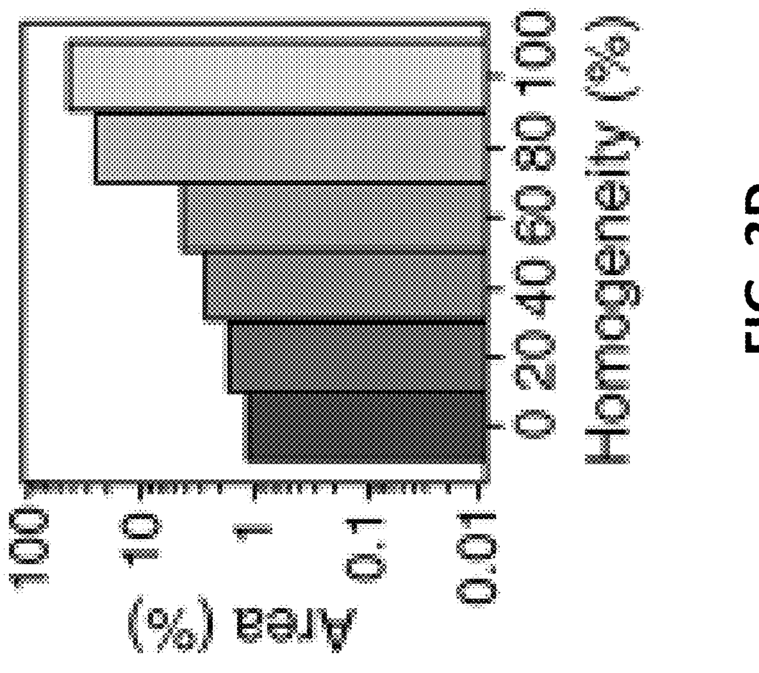
FIG. 3B and FIG. 3D show histograms of the homogeneity values for each map.
Figure 3B:
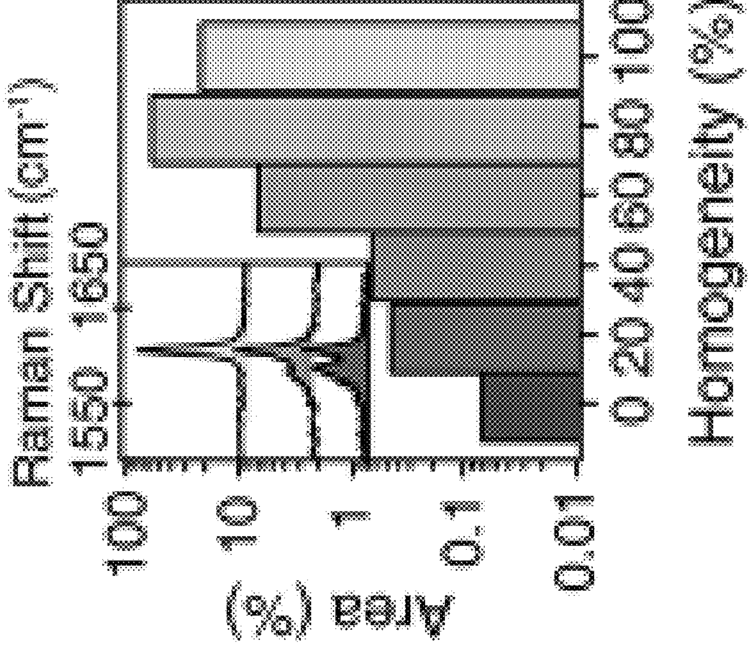
Figure 3E:
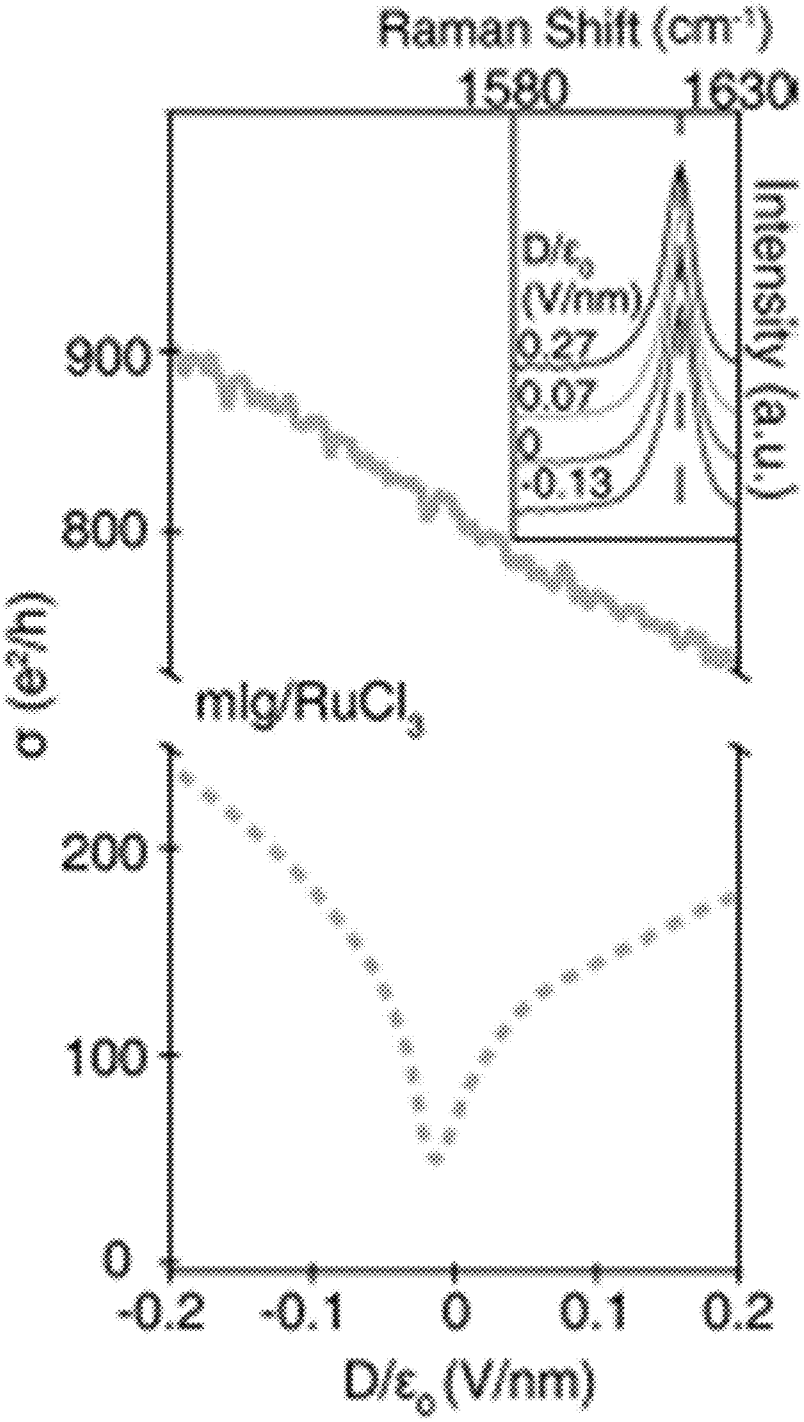
FIG. 3E shows a comparison of conductivity versus displacement field for a $RuCl_3$/mlg/$SiO_2$ device with surface contacts between the mlg and α-$RuCl_3$ (dashed) and a fully encapsulated, edge-contacted hBN/mlg/$RuCl_3$ device (solid) device. Inset, D-dependence of mlg/$RuCl_3$ Raman G peak.

These observations resolve outstanding issues in mlg/α-$RuCl_3$ devices. Specifically, the appearance of a Dirac point near zero gate voltage in otherwise extremely conductive and highly hole-doped graphene (FIG. 3E). The Raman maps for these devices exhibit lesser homogeneity (FIGS. 2A and 3A) due to numerous neutral regions (unshifted G peak). In contrast, Raman maps in devices disclosed herein with smoother interfaces reveal improved homogeneity measured by the absence of neutral regions (FIGS. 2C and 3C). Meanwhile, the conductivity minimum is lacking in similar devices, as seen in the solid yellow transport trace shown in FIG. 3E. Here the Shubnikov-de Haas oscillations show a single population of holes with no additional charge carrier populations (see FIGS. 5(A-C) through 14). Transport in device D5 in FIG. 3E yields the largest mobility, 4900 $cm^2/(V\ s)$ for single band transport in graphene at correspondingly large densities ($3\times10^{13}\ cm^{-2}$). Competing doping methods, in particular solid electrolyte gating, produce higher densities but result in significant disorder and lower mobilities (see FIG. 13 and FIG. 14). Measurements indicate that increasing the distance between the $\alpha$-$RuCl_3$ and graphene yields improved sample mobility at the expense of induced charge in the graphene, analogous to conventional modulation doping in two-dimensional electron gases.

Lastly, the range of charge transfer in $\alpha$-$RuCl_3$ heterostructures was explained via the relative twist angle. Devices disclosed herein and previous reports indicate a large variation in hole densities over 2-$4\times10^{13}\ cm^{-2}$ far greater than the spread within a single device ($\delta p\approx$1-$5\times10^{12}\ cm^{-2}$) (FIG. 4A as well as FIGS. 5(A-C) through 14). Rotating the layers relative to one another changes the overlap between the Ru d and p orbitals, impacting the charge transfer. To this end, FIG. 4D shows MINT results for charge transfer at specific angles of the graphene relative to $\alpha$-$RuCl_3$ (see FIGS. 5(A-C) through 14). The largest (smallest) charge transfer occurs at an angle of 0° (30°). The calculated carrier densities and strains for these two angles, converted to G and 2D peak frequencies, are plotted in FIG. 4A as orange and yellow diamonds (see also FIG. 4B), respectively, in close correspondence to the results for devices D1 and D3. The MINT results for a range of angles, shown in FIG. 4D, indicate continuous tuning of the charge transfer due to a change in orbital overlap.

In some embodiments, similar effects emerge from a low work function material acting as a 2D crystalline donor. As such, modulation doping can be introduced into two-dimensional heterostructures with far reaching implications. For example, a 2D material can be uniformly or locally charged by controlling the regions over which it touches a crystalline acceptor or donor. This enables a new regime of two-dimensional plasmonics, improved electrical transparency of contacts by locally doping the contacted layer, and the creation of lateral p-n junctions. Such devices require expanding the doping to a wider set of two-dimensional materials, as indicated by FIG. 1A, molecular beam epitaxy EuS, CVD graphene, and $WSe_2$ results as described herein. Furthermore, the large and local electric fields in $\alpha$-$RuCl_3$ will break inversion symmetry. As such, they enable new nonlinear responses in two-dimensional materials and tune the spin-orbit coupling. Thus, when combined with magnetic two-dimensional atomic crystals, $\alpha$-$RuCl_3$ provides new spintronic devices and topological phases such as skyrmion lattices and spin liquids. In some embodiments, interplay between the magnetism and charge transfer in $\alpha$-$RuCl_3$ heterostructures plays an important role.

Ultra-Sharp Lateral p-n Junctions in Modulation-Doped Graphene

Ideal p-n junctions in graphene with a step-function change in carrier density underlie the physics of Klein tunneling, negative refraction leading to Veselago lensing, guiding of plasmons and snake states, and may enable controlled anisotropy of the band velocity or novel electron-optical devices based on transformation optics or the ability to focus electron beams. In practice, p-n junctions defined by electrostatic gating are far from this ideal, with the change in carrier density taking place over 50-100 nm due to fringe electric fields from the edges of the metallic gates. Charge carriers traversing such broad interfaces are collimated since the likelihood of transmission is exponentially suppressed for carriers incident at increasing angles from the normal. Despite this, p-n (also p-n-p) junctions enable observation of Klein tunneling, magnetic focusing in ballistic graphene, and can be used to create a switch based on the reflection of charge carriers. But to achieve the transmission over a wide range of impact angles needed to clearly observe and apply Veselago lensing requires junctions closer to the ideal case. Modulation-doping of graphene was employed by proximity to $\alpha$-$RuCl_3$, and a well-defined boundary to the doped region via a cleaved edge of the $\alpha$-$RuCl_3$ flake, to create ultra-sharp junctions, demonstrated with evidence from electronic transport, scanning tunneling probes of the spatial variation of the charge density in doped graphene, and first principles calculations.

When the layered Mott insulator alpha-ruthenium(III) chloride ($\alpha$-$RuCl_3$) is placed in direct contact with graphene, it accepts approximately $4\times10^{13}\ cm^{-2}$ electrons, leaving the graphene strongly hole-doped. This is several times larger than can be achieved with typical back-gating for graphene-on-silicon oxide devices. If an insulating spacer is introduced between the two materials, the charge transfer persists but is weakened commensurate with the setback of $\alpha$-$RuCl_3$ from graphene. Meanwhile the carrier mobility of the graphene remains remarkably high when in direct contact with $\alpha$-$RuCl_3$, reaching 5000 $cm^2/Vs$, and can further increase with the use of an insulating spacer. This behavior is analogous to modulation doping of conventional two-dimensional electron gases, except that here the acceptor material is a crystalline sheet rather than randomly distributed impurity atoms. Because the charge transfer takes place only where $\alpha$-$RuCl_3$ overlaps graphene, the spatial distribution of the hole-doping can be readily controlled using van der Waals device fabrication techniques. Optical experiments on a first generation of devices having regions of intrinsic graphene abutting regions that were modulation-doped by $\alpha$-$RuCl_3$ placed an upper bound of 65 nm on the lateral extent of the charge transfer into the graphene sheet away from the edge of $\alpha$-$RuCl_3$ flakes, while recent infrared near-field and scanning tunneling measurements indicate the boundary can be just nanometers in width. Patterned charge-doping by $\alpha$-$RuCl_3$ thus appears to be a viable route toward ultra-sharp p-n junctions in graphene.

Here modulation doping by $\alpha$-$RuCl_3$ was used to differentially charge-dope two regions of graphene. With additional control of the carrier densities via global top and back gates, transport in the bipolar regime can be explored. Resistance measured across the junction was consistent with a very narrow and highly transmissive p-n junction at the interface of the intrinsic and doped regions. In two such devices, very different junction widths are observed which correlates with the presence or lack of a cleaved crystalline edge of the dopant $\alpha$-$RuCl_3$ flake. Low-temperature scanning tunneling microscopy and spectroscopy (STM/STS) were also used to explore devices where a graphene sheet is either directly in contact with $\alpha$-$RuCl_3$ or separated from it by thin flakes of hexagonal boron nitride (hBN). A sharp change was observed in the charge doping of the graphene over a sub-10 nm length scale across step edges in the insulating hBN spacer. Finally, density functional theory (DFT) calculations were performed to reveal that the hole-doping of graphene due to electron transfer to $\alpha$-$RuCl_3$ falls off rapidly over several graphene lattice constants away from the $\alpha$-$RuCl_3$ edge.

Figures 16A, 16B, 16C:
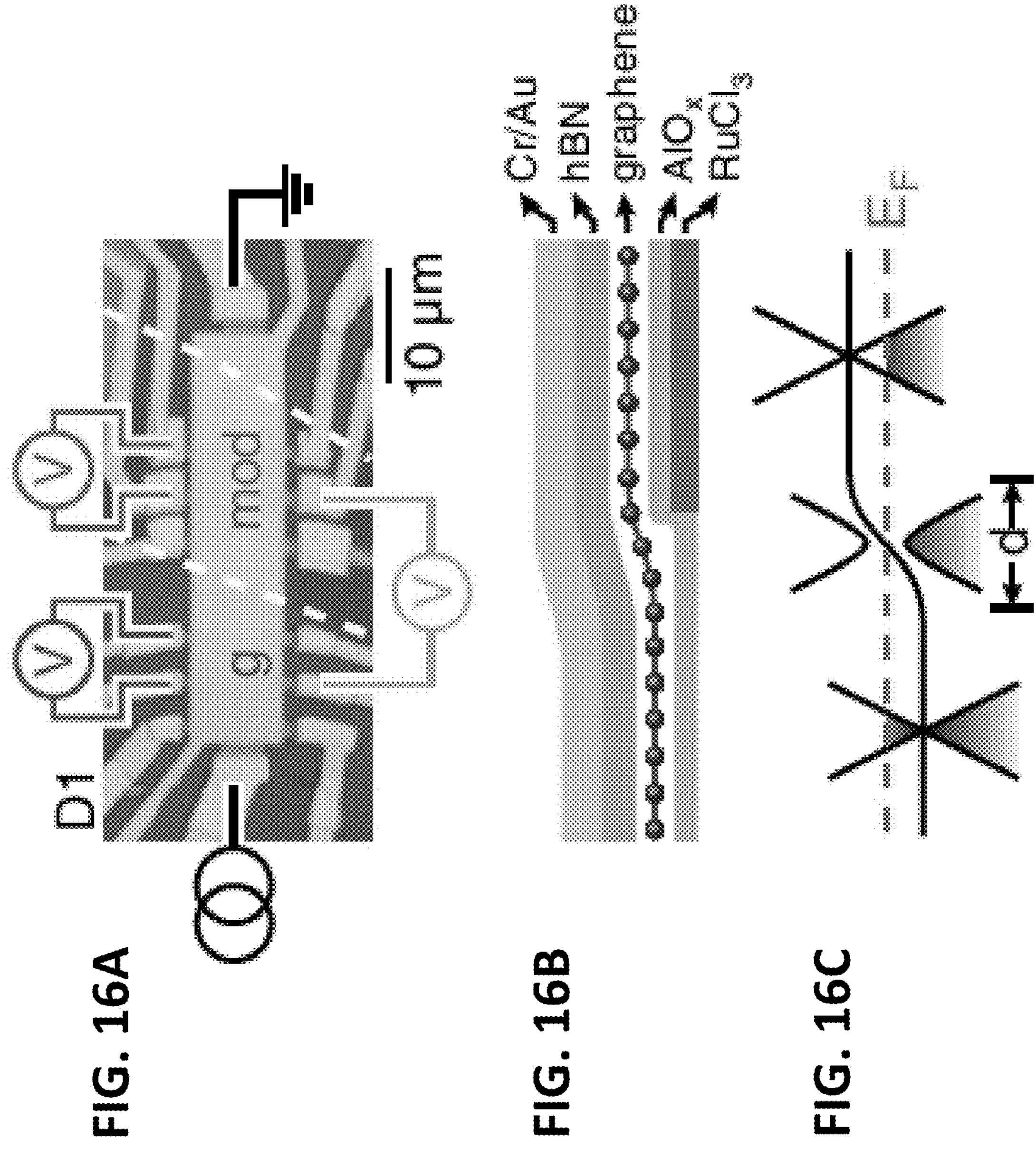
FIG. 16A shows an optical micrograph of a device. The white dashed lines indicate the α-$RuCl_3$ flake boundary separating regions of intrinsic and α-$RuCl_3$-modulation-doped graphene, labeled "g" and "mod", respectively.
FIG. 16B shows a schematic device layer profile.
FIG. 16C shows a schematic of the graphene band structure crossing from n-type to p-type across a junction of width d, showing an effective gap opening in the junction at the Fermi energy $E_F$.

Electronic Transport. The electronic transport in two graphene devices containing lateral p-n junctions was investigated. In both, half the graphene sheet is intrinsic while the other half is modulation-doped by an $\alpha$-$RuCl_3$ flake through a thin insulating layer. Device D1 has a ≈1.5-nm-thick $AlO_x$ film between the graphene and $\alpha$-$RuCl_3$, while device D2 has a 2-nm-thick flake of hBN as the spacer. FIG. 16A shows an optical microscope image of D1, which consists of a 16.5-nm-thick flake of $\alpha$-$RuCl_3$ coated by the $AlO_x$ film, topped by a graphene Hall bar that lies partly above the $\alpha$-$RuCl_3$ and partly on the bare substrate. The Hall bar is capped by a flake of hBN (≈30 nm) supporting a global Cr/Au top gate, and is contacted by Cr/Au leads. The entire device rests on 300 nm of $SiO_2$ on p-Si; the latter also serves as a global back gate. In FIG. 16A, the device regions labeled "g" and "mod" correspond to the intrinsic and $\alpha$-$RuCl_3$-doped graphene, respectively, and a profile of the device stack is shown schematically in FIG. 16B.

Figure 16E:
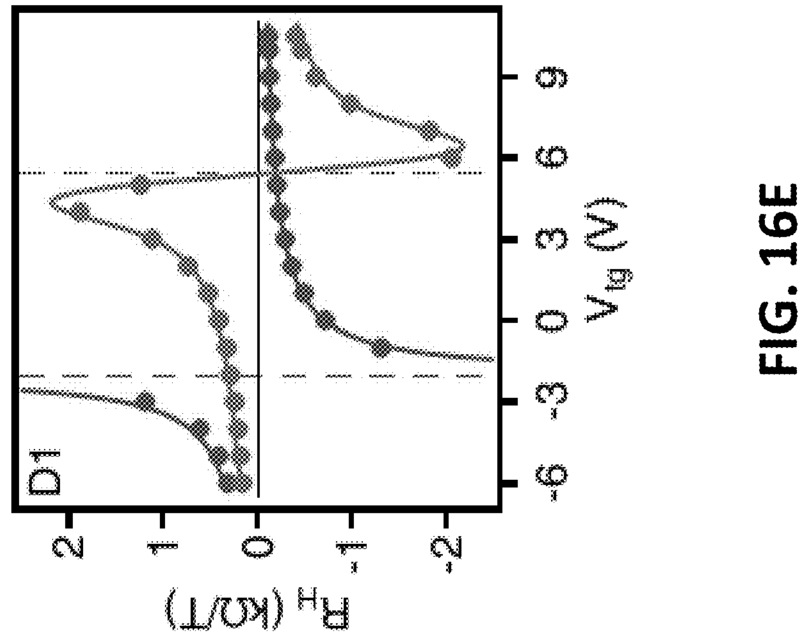
FIG. 16E shows a low-field Hall coefficient measured in g and mod regions.
Figure 16D:
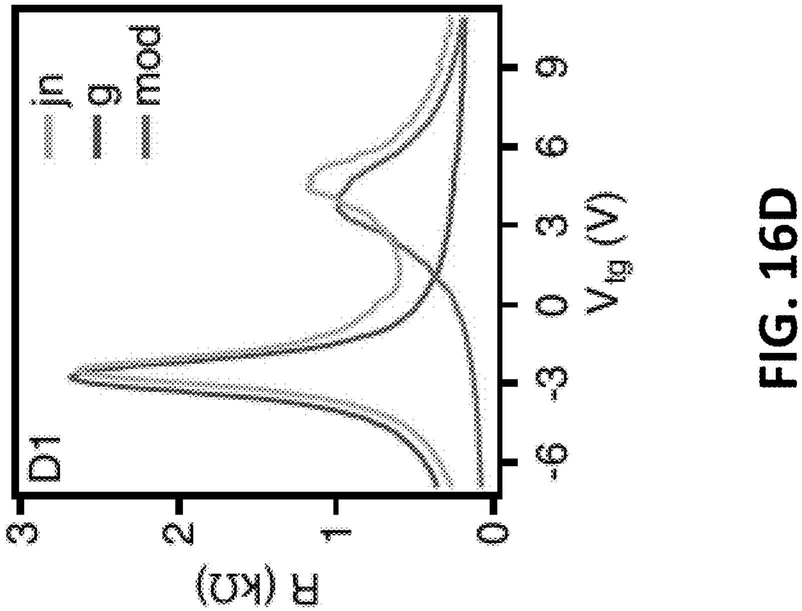
FIG. 16D shows a four-terminal resistance measured simultaneously in g (blue) and mod (orange) regions, and also across their interface (yellow), color-coded to the voltage measurement schematics of FIG. 16A.

Simultaneous four-terminal resistance measurements at T=4 K of the g and mod side of device D1 are shown in FIG. 16D, as a function of the top gate voltage. On either side of the junction, resistance maxima is typically seen at the graphene charge neutrality point (CNP or Dirac point), which are shifted by a few volts relative to each other. This shift is due to the p-type modulation-doping of graphene on the mod side by electron transfer to $\alpha$-$RuCl_3$, which persists even through an insulating barrier albeit at a reduced level. Measurements of the low-field Hall coefficient, $R_H$, shown in FIG. 16E for the g and mod regions align with this picture of modulation doping. The gating efficiency is extracted by fitting the g-side data (blue circles) to the expected density dependence $R_H=-1/ne$, while the mod-side data are better fit using a convolution of $R_H$ with a Gaussian representing a distribution of carrier densities to capture effects of electron-hole puddling in disordered graphene, with rms width $\sigma=3.5\times10^{11}$ $cm^{-2}$. The difference in carrier density of the two regions due to the modulation doping is $3.2\times10^{12}$ $cm^{-2}$. Similarly, in the hBN-spaced device D2, the modulation doping level is $1.5\times10^{12}$ $cm^{-2}$. Typical g-side (mod-side) mobilities and mean free paths in D1 range from 8,000-12,000 $cm^2$/Vs and 100-250 nm (6,000-10,000 $cm^2$/Vs and 50-200 nm). Intriguingly, although both the top and back gates are global, the carrier densities on either side can be independently tuned, implying the $\alpha$-$RuCl_3$ flake lying between the graphene and the substrate is screening the back gate electric field. This enables independent tuning of the carrier densities and polarities on both sides of the device to explore electronic transport in the n-n', p-p', and p-n regimes.

The width of a graphene p-n junction can be determined by its contribution to the total device resistance. Charge carriers incident on a p-n junction in graphene obey an electronic analog of Snell's law at an interface of right- and left-handed optical materials: the momentum along the junction, $k_y=k_F \sin\theta$, is conserved, but the momentum $k_x$ normal to the junction changes sign along with the sign of the carriers in passing from one side to the other with the end result being a negative refraction. Here $k_F$ is the Fermi momentum and $\theta$ is the carrier angle of incidence on the junction measured from the normal. Across an ideal abrupt junction, carriers transmit to a final state with probability $T(\theta)=\cos^2\theta$ due to pseudospin conservation. In real devices there is always a density gradient from p-to n-type over some characteristic junction width d, analogous to the depletion region of a classical doped-Si p-n junction but having a different origin. Although there is no band gap in graphene, an effective gap to transmission arises when $k_x(x)=\sqrt{(E(x)/\hbar_F)^2-k_y^2}$, becomes imaginary, where $E(x)=\hbar_F k_F$ is the position-dependent energy of the graphene Dirac point across the junction, and $v_F\approx10^6$ m/s is the Fermi velocity. This is depicted schematically in FIG. 16C. Tunneling across this gap results in a reduced probability of transmission as a function of impact angle and junction width which, for a balanced junction (|p|=|n|), is given by $$T(\theta, d) = \cos^2\theta e^{-\pi k_F d \sin^2\theta}$$

In turn, the reduced transmission leads to a finite resistance that has both ballistic and diffusive contributions, $R_{p-n}=R_{bal}+R_{dif}$, with magnitudes depending primarily on the carrier mean free path relative to the junction width but also on many-body effects. Experimentally, p-n junction resistances have ranged from a few hundred ohms in graphene-on-oxide junctions to 100Ω in hBN-encapsulated junctions.

Figure 17B:
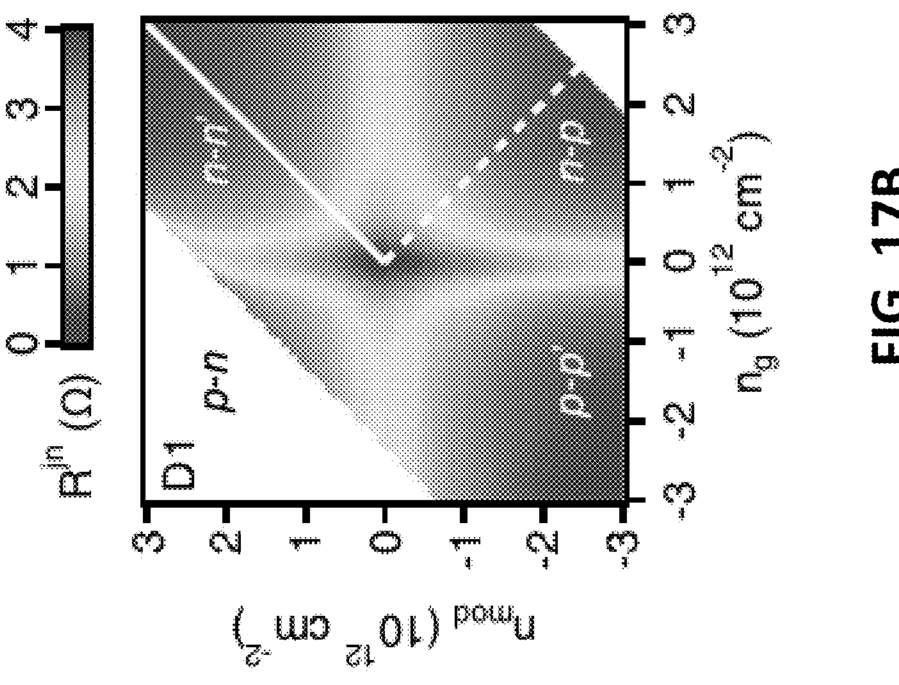
FIG. 17B shows four-terminal resistance similar to FIG. 17A, re-plotted as a function of the g- and mod-side carrier densities. The labels show the polarity of the four quadrants defined by the charge neutrality peaks, either monopolar (e.g. n-n') or bipolar (n-p). White solid and dashed lines mark where the carrier density on either side of the interface is equal (n-n), or of equal magnitude but opposite sign (p-n).
Figure 17A:
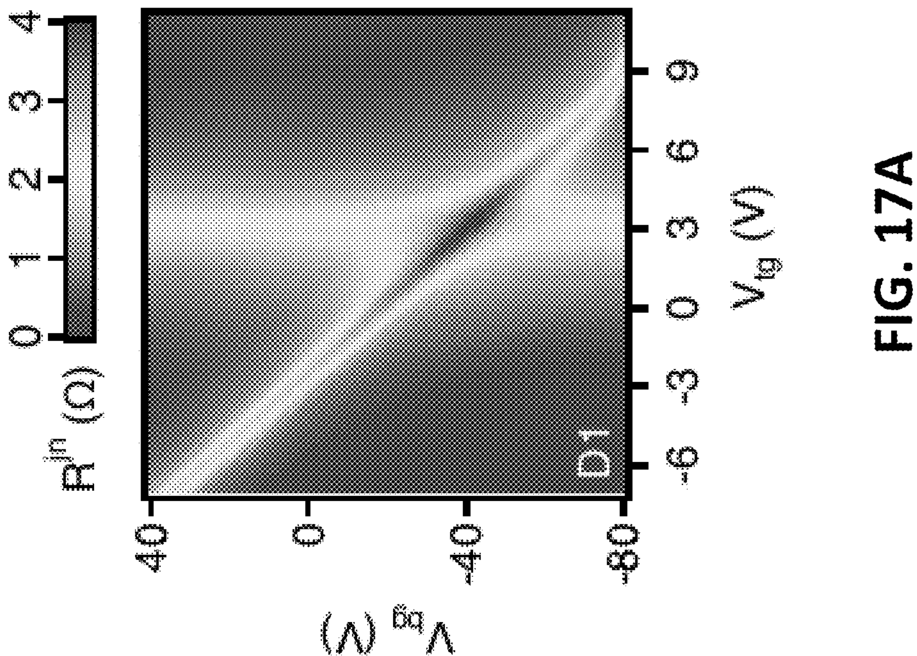
FIG. 17A shows four-terminal resistance across the interface of intrinsic (g) and modulation-doped (mod) graphene, as a function of top and back gate voltages.

In the following, the width of lateral p-n junctions was extracted in two devices as follows, illustrating the procedure by closely analyzing transport in device D1. First, FIG. 17A shows the total resistance across the junction, $R^{jn}$ (using the contacts marked in yellow in FIG. 16A for D1) as a function of the top and back gates. This quantity includes the sheet resistances from either side of the junction, and $R_{p-n}$ due to the junction itself. The density of the intrinsic portion of the graphene depends on both gates as $n_g=a_{tg}V_{tg}-a_{bg}V_{bg}+n_{g,0}$, while the $\alpha$-$RuCl_3$-doped portion depends only on the top gate via $n_{mod}=a_{tg}V_{tg}+n_{mod,0}$. Here the top and back gating efficiencies are $\alpha_{tg}=4.4\times10^{11}$ $cm^{-2}$/V and $\alpha_{bg}=6.0\times10^{10}$ $cm^{-2}$/V, respectively, and the densities for zero applied gate bias are $n_{g,0}=1.1\times10^{12}$ $cm^{-2}$ and $n_{mod,0}=-1.3\times10^{12}$ $cm^{-2}$. Using these relations, in FIG. 17B $R^{jn}$ is re-plotted vs the carrier densities of the intrinsic graphene, $n_g$, and the modulation-doped graphene, $n_{mod}$. The CNPs of these two differentially-doped regions appear as vertical and horizontal bands that separate the regimes of same-sign (p-p' or n-n') carrier transport across the interface from regions having bipolar transport.

Figure 17D:
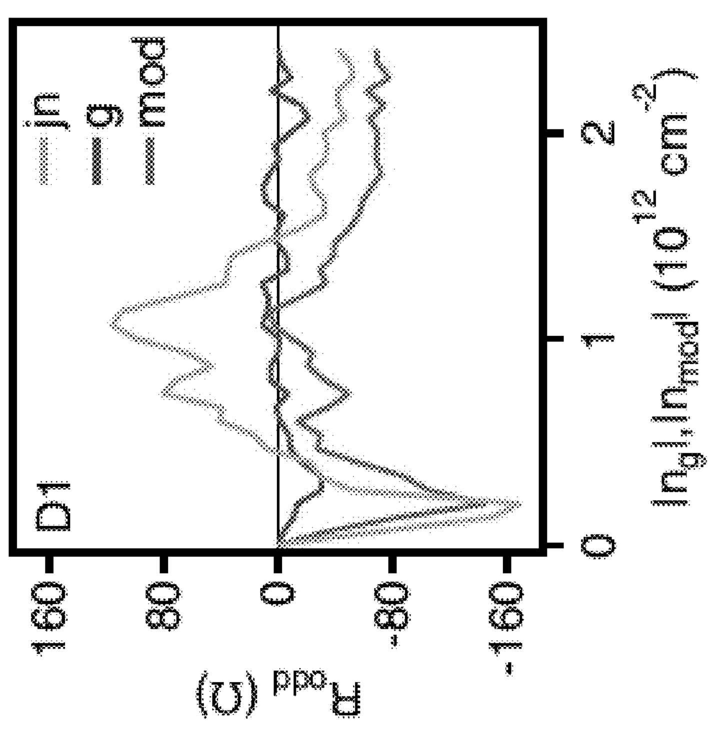
FIG. 17D shows a difference of $R^{jn}$ (yellow) for the two curves in FIG. 17B; and of the g-side resistance $R^g$ (blue) and mod-side resistance $R^{mod}$ (orange) for linecuts at the same carrier densities (or gate voltages).
Figure 17C:
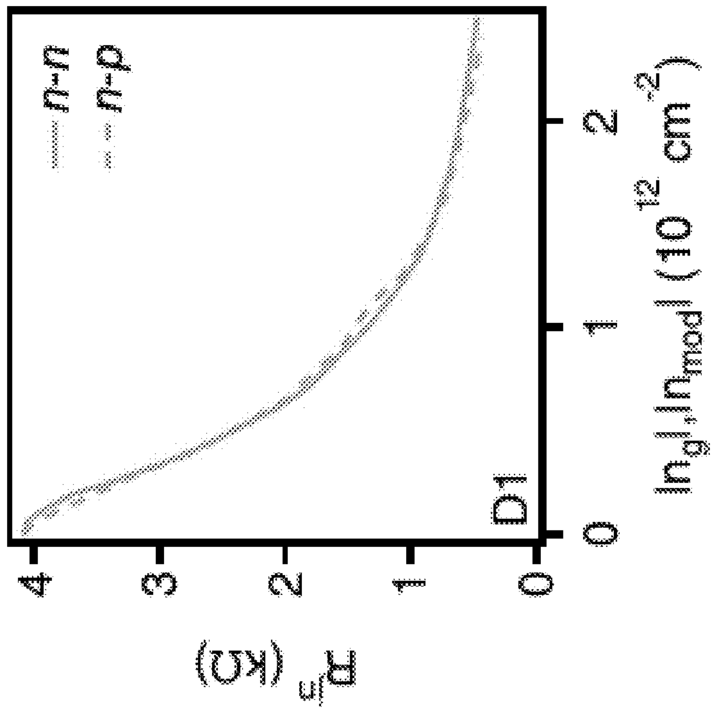
FIG. 17C shows a comparison of resistances at the white solid and dashed lines in FIG. 17B.

Next the resistance is isolated, Rp-n, of the p-n junction itself, starting with line cuts of $R^{jn}$ along lines of equal carrier density and same sign ($n_g=n_{mod}>0$, yielding $R^{jn}_{n-n}$) or opposite sign ($n_g=-n_{mod}>0$, $R^{jn}_{n-p}$). These are plotted together in FIG. 17C. To the extent that sheet resistances on either side of the interface are the same in both line cuts, the difference of these curves, $R^{jn}_{odd}=R^{jn}_{n-p}-R^{jn}_{n-n}$, will be due only to the resistance of the p-n junction: $R^{jn}_{odd}=R_{p-n}$. In fact, for these line cuts the g-side sheet resistance ought to be identical: the intrinsic graphene contributes the same resistance vs density to both. In contrast, the two line cuts include either n- or p-type doping of the mod side, so any asymmetry about the CNP in this region will add a trivial resistance to $R^{jn}_{odd}$ that must be subtracted off. To determine the presence of this trivial contribution, resistance maps are generated analogous to FIG. 17B for both the g and mod side. From equivalent line cuts along the n-n and n-p directions, $R^{g}_{odd}$ and $R^{mod}_{odd}$ were calculated. These, along with $R^{jn}_{odd}$, are shown in FIG. 17D. As expected, $R^{g}_{odd}$ lies close to zero; but $R^{jn}_{odd}$ and $R^{mod}_{odd}$ are finite and share a similar line shape.

Figures 17E, 17F:
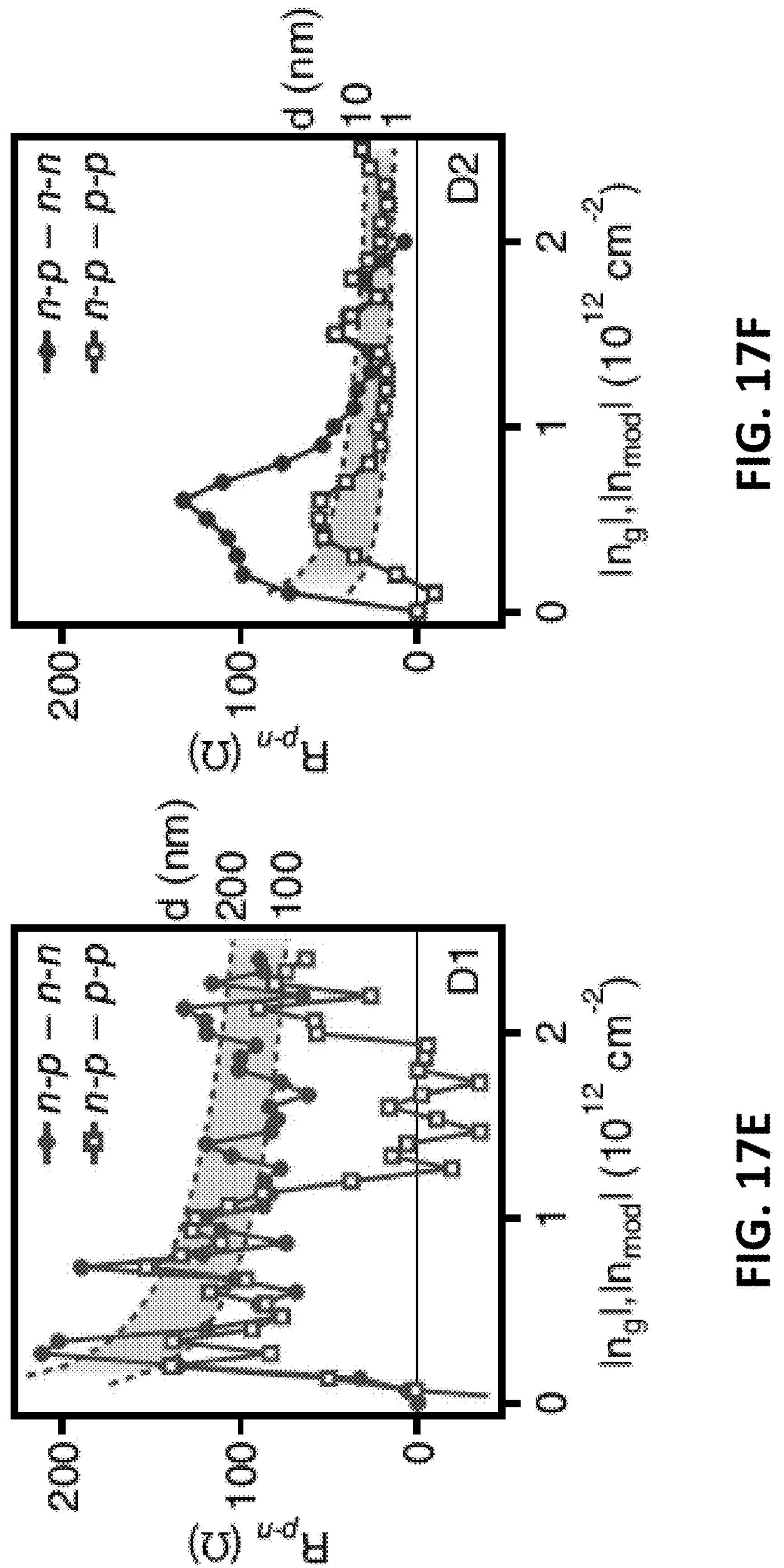
FIG. 17E shows p-n junction resistance for device D1. Shaded region marks the theoretical resistance for a ballistic device with junction width ranging between 100 and 200 nm.
FIG. 17F shows p-n junction resistance for device D2. Shaded region marks the theoretical resistance for a ballistic device with junction width ranging between 1 and 10 nm.

It remains to subtract this asymmetric part of the sheet resistance to finally obtain the resistance of the p-n junction: $R_{p-n}=R^{jn}_{odd}-(c_g\times R^{g}_{odd}+c_{mod} R^{mod}_{odd})$, where $c_i$ are scaling factors appropriate for the geometry of the contacts. FIG. 17E shows the resulting $R_{p-n}$ values, along with an identical analysis for linecuts along the (n-p) and (p-p) directions which yield approximately the same junction resistance. Indeed, both show values of ~100Ω (but for a brief excursion by the (p-p)-derived trace which can be attributed to a dip in $R^{jn}$). FIG. 17F shows the result of a similar analysis carried out in device D2, where both curves show peaks at low density that rapidly converge to values between 20 and 30Ω over much of the carrier density range.

These results are compared to theoretical predictions for electronic transport through p-n junctions in disordered graphene, and find evidence for an ultra-sharp junction having width d≤10 nm in device D2. In the theory, transport across the junction is a sum of ballistic and diffusive contributions; which term is dominant depends on the ratio of the carrier density gradient across the interface to the impurity density, $\beta=n'/n^{3/2}_{imp}$, where $n_{imp}$ is determined from the carrier mobility μ by $n_{imp}$=el(hμ). For β»1 (<<1) the junction transport is predominantly ballistic (diffusive). To calculate β in these devices, the density gradient is estimated for balanced junctions as n'=2|n|/=d, where n is the density of electrons or holes on both sides of the interface; and using the experimentally measured mobilities to find $n_{imp}$, both devices easily satisfy β»1 for any value of d below 300 nm. Accordingly, the experimentally-determined junction resistance $R_{p-n}$ is compared to the predicted resistance of a ballistic junction, $R_{bal}=c(h/e^2)/(\alpha^{1/6}n'^{1/3}W)$. Here W is the device width, α≈0.3 (0.5) is the graphene fine structure constant for the device with $AlO_x$ (hBN) spacer, and c≈1 captures the (α-dependent) effect of many-body effects in the ballistic junction. In this equation the only remaining free parameter is the junction width d in the density gradient n', so d is varied to produce curves of $R_{bal}$ as a function of carrier density that best fit the data. The results are plotted in FIGS. 17E and 17F as shaded bands that span 100 to 200 nm and 1 to 10 nm, respectively.

Device D2 is thus found to have an ultra-sharp, sub-10-nm junction, while D1 has a much wider ~100 nm junction. This result is surprising because the two devices are so different. Both have insulating spacers of approximately the same thickness, with modulation-doping values that differ by only a factor of two. The differing mobilities are unlikely to be the culprit, since the β parameter indicates transport across the junction is firmly in the ballistic regime. The interface in device D1 is angled at 22° so the junction appears wider, but only by a factor of 1/cos(22°)≈1.08. Ultimately, inspection of the constituent flakes of the devices offers a clear resolution: in D1, the edge of the α-$RuCl_3$ flake at the boundary between the intrinsic and modulation-doped regions is slightly curved and has no obvious relation to its crystalline axes. In contrast, in D2 the relevant edge is visually straight and makes an angle of ≈119° with another portion of the flake just outside where it contacts the graphene. This indicates the boundary in D2 is a cleaved crystalline edge, but in D1 is likely to be rough with various facets along the edge.

In the embodiments of the present disclosure, charge transfer takes place when a 2D active conducting material and a 2D charge transfer source material overlap such that the 2D active conducting material overlaps the 2D charge transfer source material including at least one edge of the 2D charge transfer source material. In some embodiments, the edge of the 2D charge transfer material may have a straight or non-straight edge, and/or may have a cleaved or non-cleaved edge. As disclosed herein, a straight edge helps define the spatial boundary of the charge transfer such that the boundary can be quite sharp (e.g., with a straight, cleaved edge). The boundary is defined by the charge transfer region's edge (i.e., the length over which the charge transfer effect ceases to operate), with an ultra-sharp boundary being on the order of from about 1 nm to about 10 nm wide. In embodiments without such a cleaved edge, the charge transfer region's edge may have a length of from about 100 nm to about 200 nm.

Figures 18A, 18B:
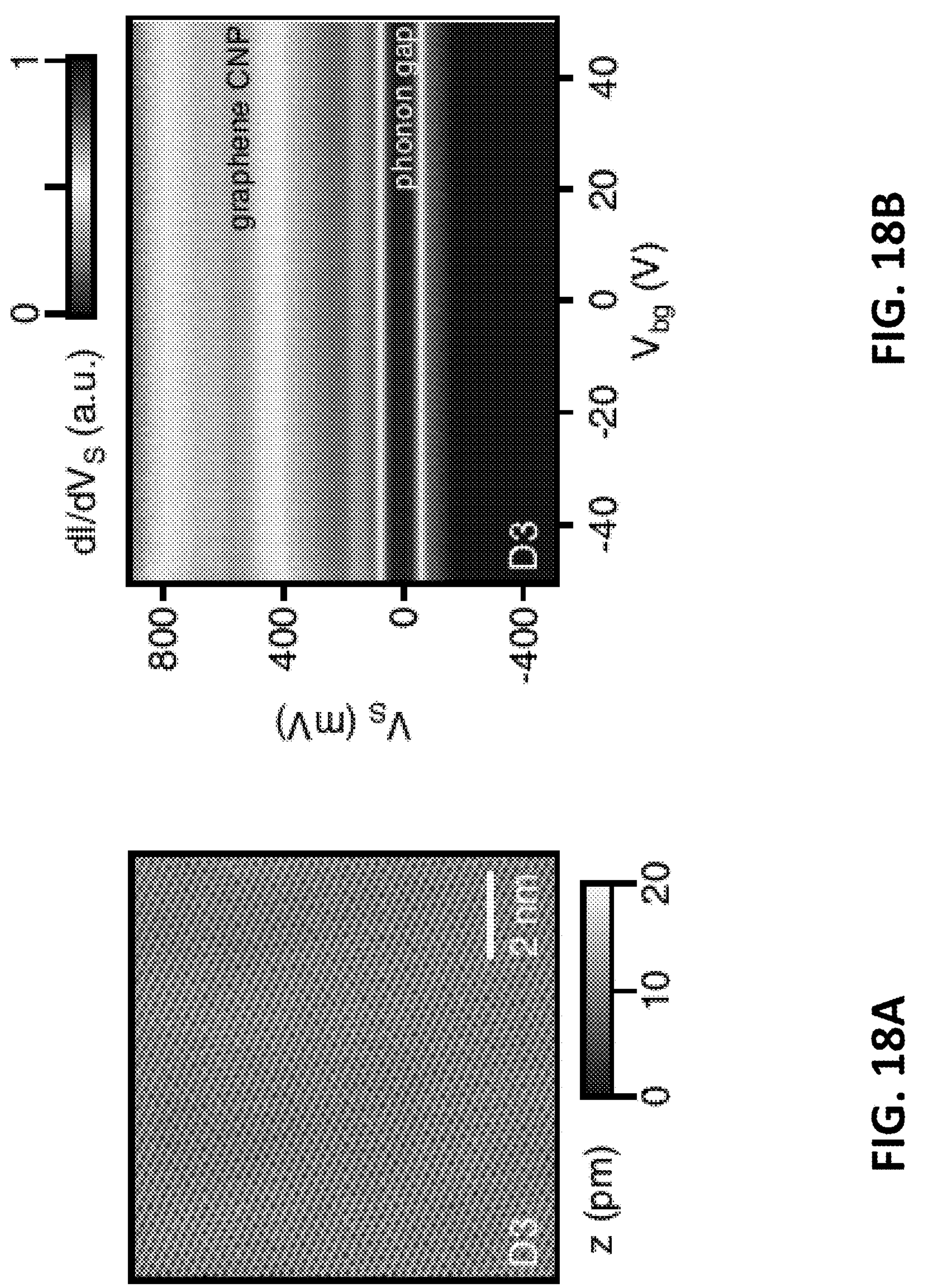
FIG. 18A shows atomically resolved STM topography of a 10×10 $nm^2$ region taken on graphene/α-$RuCl_3$ in Device D3 at T=4.8 K.
FIG. 18B shows a color map of the measured $dI/dV_S$ ($V_S$,d) from region in FIG. 18A, as a function of gate voltage applied to substrate. The strong feature near $V_S$=0 mV corresponds to phonon-assisted inelastic tunneling while the additional suppression in intensity near $V_S$=560 mV corresponds to the graphene charge neutrality point.
Figure 18C:
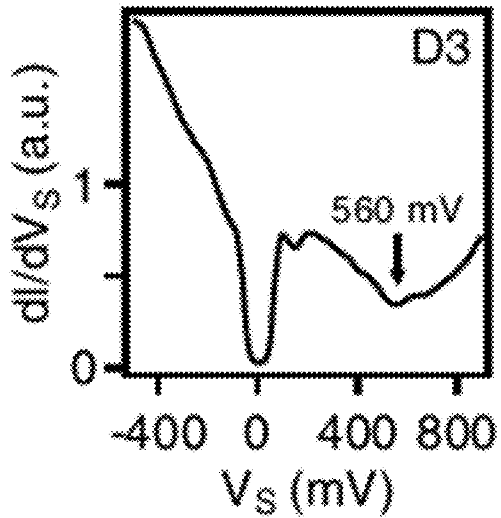
FIG. 18C shows average of spectra across all $V_{bg}$ shows a clear phonon gap and minimum at CNP.

Scanning Tunneling Microscopy. Scanning tunneling microscopy and spectroscopy measurements at T=4.8 K were used to further study the spatial variation of the Dirac point across differentially-doped regions, in two other devices, D3 and D4, both composed of overlapping flakes of graphene, hBN, and α-$RuCl_3$ on a $SiO_2$/p-Si substrate. FIG. 18A shows a pristine atomically resolved topography of graphene in D3, where the lack of a moiré pattern indicates this region consists of graphene in direct contact with α-$RuCl_3$. Additional scans nearby exhibit similar behavior, while farther afield moiré patterns were found as expected for graphene-on-hBN. The differential tunneling current, $dI/dV_S$, proportional to the local density of states (LDOS), is acquired as a function of the tip-sample bias, $V_S$, and a back gate voltage applied to the substrate, $V_{bg}$, with results plotted in FIG. 18B where a dark blue (brown) color corresponds to high (low) LDOS. A strong dark brown band centered about $V_S$=0 mV appears along with several fainter features, none of which exhibit any dependence on $V_{bg}$. The averaged spectra from $V_{bg}$=−50 V to +50 V in FIG. 18C clearly shows a 120-mV-wide U-shaped suppression of $dI/dV_S$ centered about $V_S$=0 mV, with a less pronounced and broader suppression having a minimum at $V_S$=560 mV. The width of the strong dark brown band marks it as a familiar phonon-assisted inelastic tunneling gap, while the broader second feature corresponds to the graphene Dirac point. The graphene carrier density was estimated using $n_g=(E_{DP}-\hbar\omega)^2/(\pi\hbar^2v^2_F)$, with ℏω the phonon energy and $E_{DP}$ the energy of the Dirac point in FIG. 18C, and observed an exceptionally large p-type doping of $n=-1.8\times10^{13}$ $cm^{-2}$. This is on the low side of prior observations of charge transfer in graphene/α-$RuCl_3$ but still quite large relative to typical back-gate-induced densities. The surprising lack of response to the gate voltage corroborates the screening effect noted for the α-$RuCl_3$-doped graphene device above.

Figure 18F:
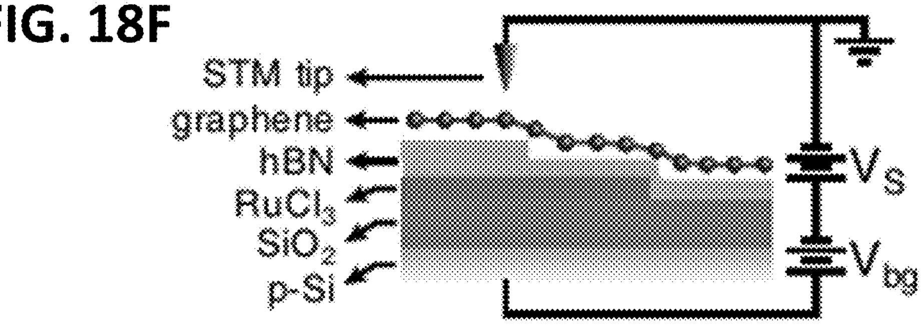
FIG. 18F shows a schematic of measurement over step edges in graphene/hBN/α-$RuCl_3$/$SiO_2$/Si heterostructure.
Figure 18G:
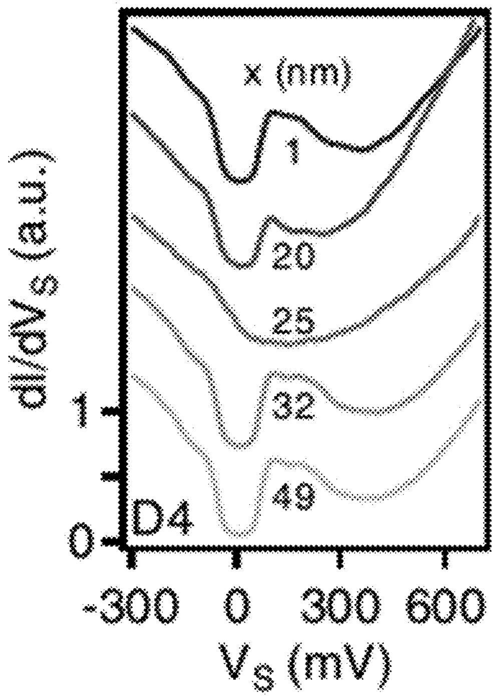
FIG. 18G shows measured $dI/dV_S$ spectra at various x positions along white line in FIG. 18D, highlighting the non-monotonic shift of the CNP feature.
Figure 18E:
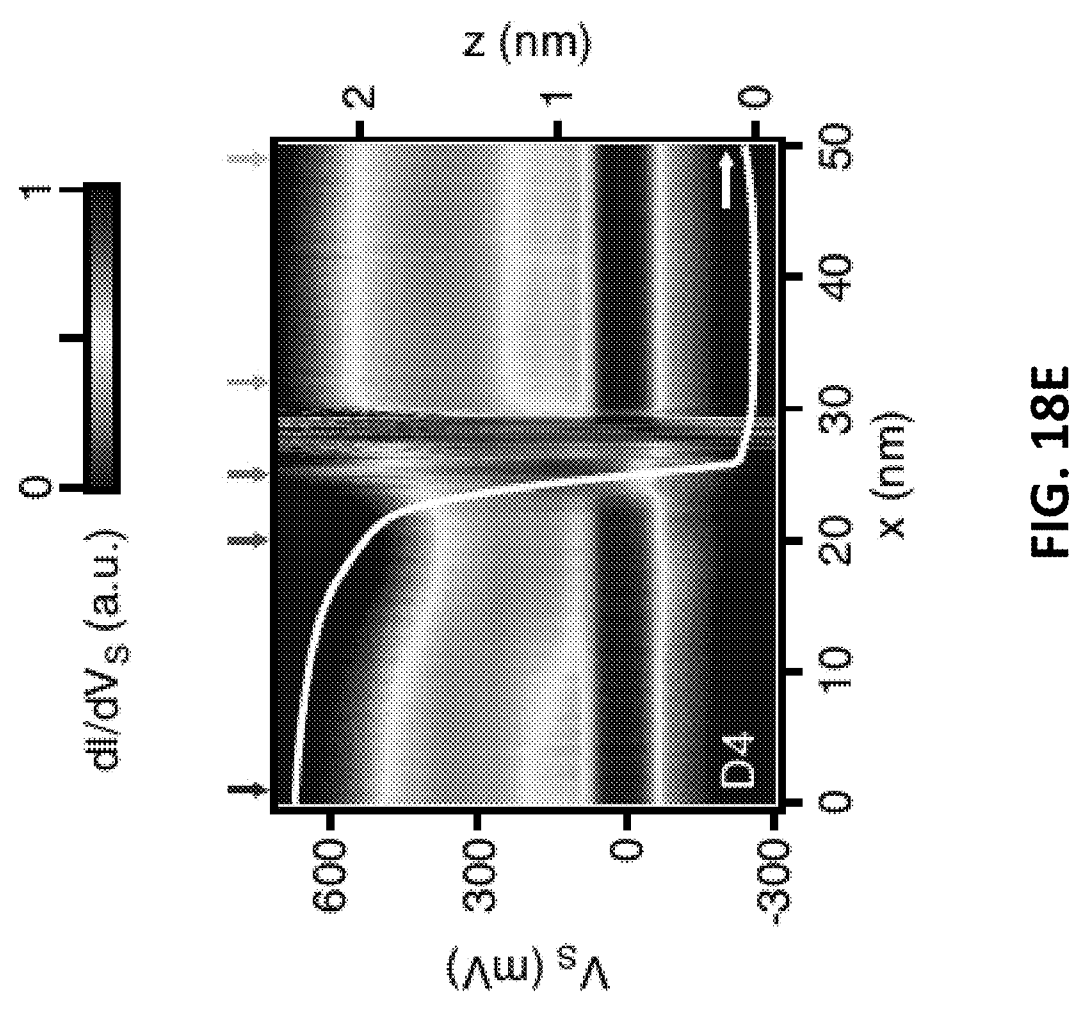
FIG. 18E shows a color map of the measured $dI/dV_S$ along the white line over a step edge in FIG. 18F. The phonon gap and graphene CNP are readily visible, with the latter showing a non-monotonic dispersion as the tip travels over the step edge. White line tracks the change in tip height in crossing the step.
Figure 18D:
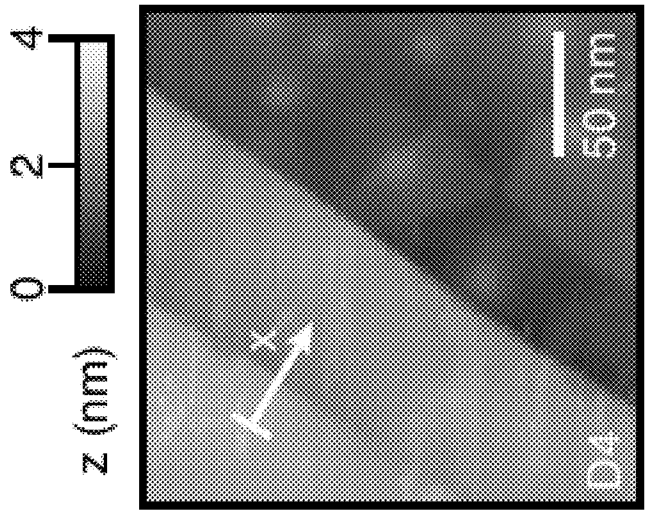
FIG. 18D STM topography of a 200×200 $nm^2$ window in a graphene/hBN/α-$RuCl_3$ region in Device D4.

When an hBN spacer layer of variable thickness is inserted between the graphene and α-$RuCl_3$ as shown in FIG. 18F, multiple step edges were observed appearing from upper-left to lower-right in the large scale topographical map of device D4 in FIG. 18D. In FIG. 18E, $dI/dV_S$ spectra are shown, acquired over one such edge (following the arrow in FIG. 18D) as a function of both $V_S$ and position x; the white curve shows the height profile (right axis) along the path with at first a shallow and then steep decrease correlated with the location of the step edge. As above, the phonon gap appears at $V_S$=0 mV, but the graphene CNP feature disperses non-monotonically with x, briefly decreasing as the step edge is approached and then sharply increasing to a final plateau as the step edge is crossed. Point spectroscopy taken at different x values shown in FIG. 18F further illustrates the non-monotonic variation of the CNP across the step edge. Far from the edge, the charge density is found to be $5.8\times10^{12}$ $cm^{-2}$ ($8.3\times10^{12}$ $cm^{-2}$) for the higher (lower) step, confirming that larger charge transfers are associated with thinner hBN spacer layers. The positive shift of the CNP takes place rapidly over ≈7 nm. An instability in STS is observed right at the step edge, indicating that the graphene is suspended over the step and thus briefly decoupled from the underlying hBN and α-$RuCl_3$.

Figures 19A, 19B, 19C:
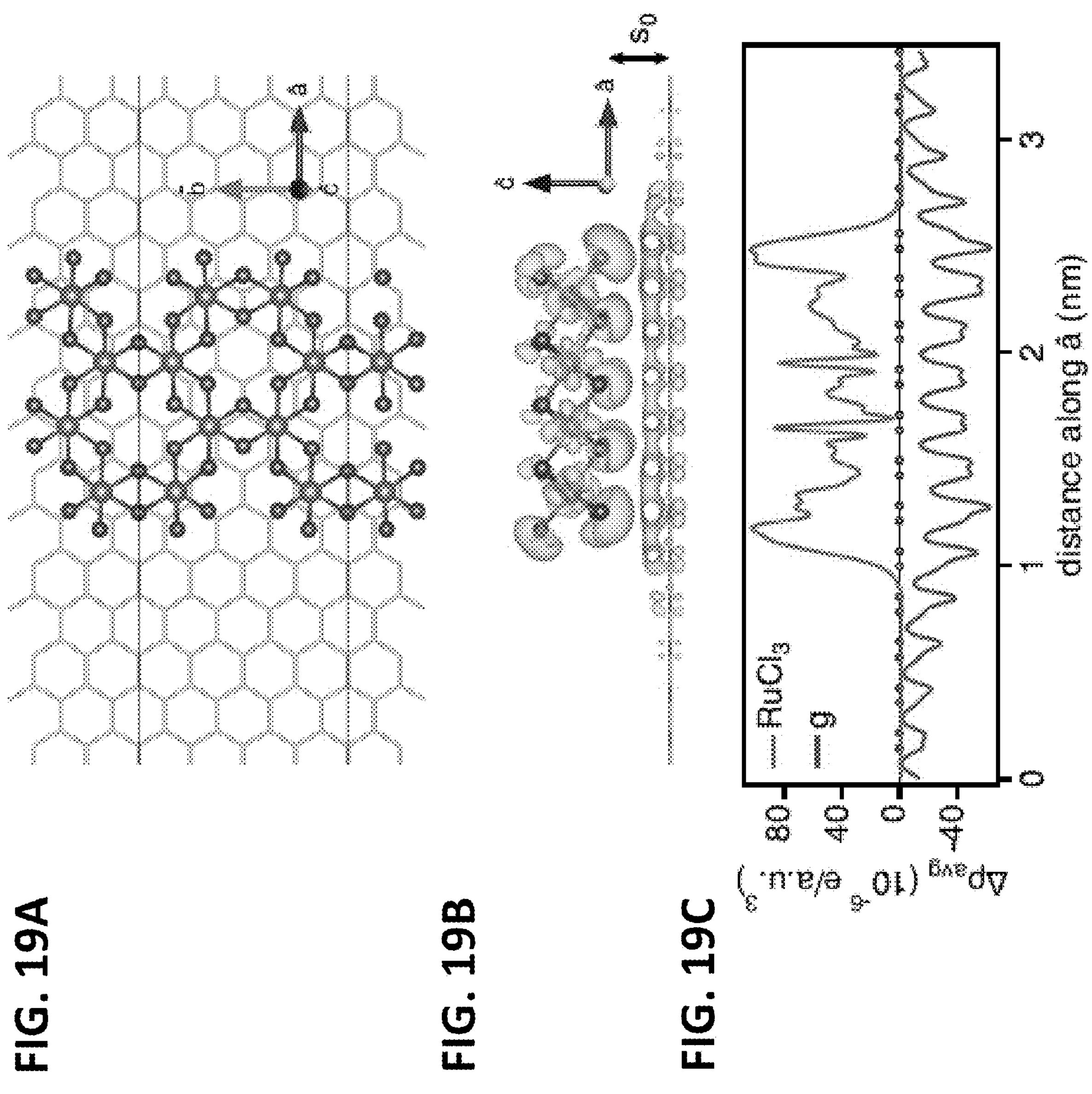
FIG. 19A shows a top view of the supercell and the corresponding orthogonal directions of the lattice vectors â, b̂, and ĉ). The blue (red) spheres represent the Ru (Cl) atoms.
FIG. 19B shows a side view of supercell with illustration of the change in charge density, Δp, showing accumulation and depletion in beige and teal, respectively. The isosurface value of Δp is chosen to be $5\times10^{-4}$ e/a.u.$^3$, and $s_0$=3.31 Å is the equilibrium separation of the relaxed geometry.
FIG. 19C shows a planar average of the change in charge density (b̂, ĉ plane) along the â direction, $\Delta\rho_{avg}$, separated by color for charge on α-$RuCl_3$ (orange) and graphene (blue).

Density Functional Theory Calculations. To understand both the lateral and vertical spatial distribution of the charge transfer due to the modulation-doping of graphene by α-$RuCl_3$, first principles calculations were performed of a monolayer-thick α-$RuCl_3$ ribbon on graphene as shown in FIGS. 19A and 19B. By using DFT calculations as implemented in VASP, the properties of the interface were calculated when no spacer layers are present in a large supercell in the ribbon-on-sheet geometry (see FIG. 19A), with lattice parameters a=34.16 Å, b=9.84 Å and c=20 Å (distance between periodic images along c direction is 16.5 Å), and the graphene C—C bond-lengths fixed at 1.42 Å. Geometrical optimization of the internal atomic degrees of freedom leads to a mildly distorted Ru hexagon with shorter Ru—Ru bonds ($l_s$=3.17 Å) arranged in a periodic-step-function like pattern along the direction $\hat{b}$, compared with the other Ru—Ru bonds of the ribbon ($l_s$=3.48-3.52 Å).

With the two materials in close proximity, a new charge density distribution develops which was illustrated by calculating the difference with respect to the intrinsic materials, $\Delta\rho=\rho_{\alpha R/g}-\rho_{\alpha R}-\rho_g$. Charge accumulates in the α-$RuCl_3$ ribbon with a concomitant depletion in the graphene, as shown in FIG. 19B where the charge isosurface was plotted at $|\Delta\rho|=5\times10^{-4}$ e/a.u.$^3$, and in FIG. 19C by directly plotting the variations in the planar average of Δρ (over $\hat{b}\times\hat{c}$) along the $\hat{a}$ direction for the graphene and α-$RuCl_3$ layers. These results are in accord with findings for the graphene/α-$RuCl_3$ commensurate bilayer case. FIG. 19C shows the excess electronic charge in α-$RuCl_3$ tends to lie largely on the Cl atoms facing the graphene. The majority of the charge depletion in graphene is concentrated at the C atom locations underneath the α-$RuCl_3$, reaches maxima near the boundaries of the α-$RuCl_3$ ribbon, and proceeds to decrease rapidly beyond the edge. Adding a second α-$RuCl_3$ layer does not qualitatively alter this result.

Figures 19D, 19E:
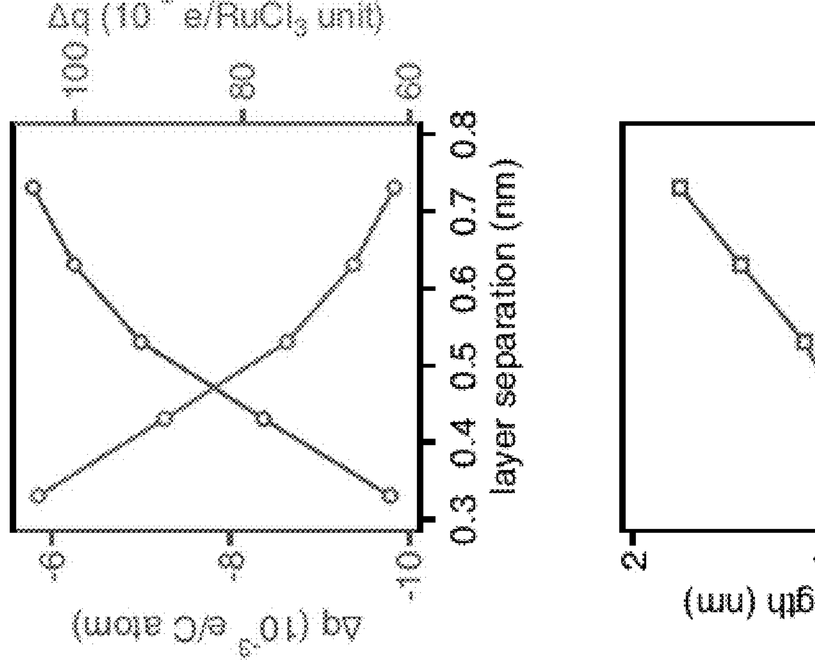
FIG. 19D shows a total integrated charge on α-$RuCl_3$ (orange, right axis) and graphene (blue, left axis) as a function of separation between the layers.
FIG. 19E shows a decay length of charge distribution in graphene as a function of lateral distance away from the edge of the α-$RuCl_3$ ribbon.

The equilibrium height of the α-$RuCl_3$ above the graphene, $s_0$=3.31 Å, is defined as the average distance between the C atoms in graphene and the graphene-facing Cl atoms in α-$RuCl_3$, shown in FIG. 19B. To mimic the presence of a dielectric spacer layer, it was calculated how the charge transfer changes if the separation is increased up to an additional 4 Å (without further relaxing the geometry, but with the lattice parameter c also increased up to 24 Å). The results, in FIG. 19D, show a clear decrease of the charge exchange between the two layers, in qualitative agreement with the observed modulation doping effect. Performing the calculation with a dielectric present alters the absolute magnitude of charge transfer yet keeps the relative changes similar to results described herein.

Finally, the characteristic length scale can be estimated over which the charge transfer decays away outside the ribbon by fitting the decrease of the charge density peaks around the C atoms, visible in FIG. 19C, as a function of distance. The best fit to the data is made using an equation of the form $Ae^{-(x-x0)/B}$, with $x_0$ measured along a from the average position of the zigzag C atoms just outside the α-$RuCl_3$ ribbon. The decay length, B, plotted in FIG. 19E is an average of the fits made on either side of the α-$RuCl_3$ ribbon, and is found to be roughly 2.5 times greater than the graphene/α-$RuCl_3$ separation.

By three distinct and complementary approaches, sub-10 nm changes are demonstrated in the charge doping of graphene near the edge of an α-$RuCl_3$ flake, or across a step height in an insulating barrier between these two materials. To achieve such a sharp boundary, it appears crucial to use a cleaved, crystalline edge of α-$RuCl_3$ to clearly define an ultra-sharp boundary of the modulation-doped region. p-n junctions defined this way are narrow enough to enable observation of electron-optical effects such as Veselago lensing and other useful devices based on electron refraction or reflection.

Ultimate junction width limits. The decay length extracted from the present DFT calculations—which assume a crystalline armchair edge to the α-$RuCl_3$ ribbon—is just a few times greater than the graphene/α-$RuCl_3$ separation distance. In device D2, the insulating spacer layer is 2 nm thick, so that a junction width of ≈5 nm is expected, and a line is extrapolated from the data in FIG. 19E to greater layer separation values. Two further points bear noting: First, the measured charge transfer from monolayer graphene is no different whether the graphene is placed on monolayer or bilayer α-$RuCl_3$. DFT analysis supports this claim, finding little change in the charge density of a second α-$RuCl_3$ flake. Thus D2 has a capacitor geometry with two monolayer charge distributions separated by just 2 nm. Second, the charge distribution in the α-$RuCl_3$ is not uniform. Beyond the variations within each unit cell, there is a greater accumulation near the ribbon edge visible in FIG. 19C. Altogether, the picture is reminiscent of a classical charge distribution found for a conducting ribbon over a metallic plane. This indicates the extent of the potential variation in graphene beyond the edge of α-$RuCl_3$ (e.g. the junction width) is, apart from a possible role for nonlinear screening at short length scales, essentially a matter of electrostatics, and so likely due to the usual fringing electric fields. Thus the narrowest p-n junctions can be achieved by placing a flake of α-$RuCl_3$ with a cleaved edge as close as possible to the graphene.

In the pursuit of nearly-ideal p-n junctions, recent work has identified three outstanding hurdles: finite junction width, junction interface roughness, and nonlinearity and asymmetry of the doping profiles around the junction. The present disclosure describes elimination of all of these problems (with the possible exception of nonlinear screening effects) by using the cleaved crystalline edge of a flake of α-$RuCl_3$ to define a sharp edge between differentially-doped regions of graphene. This advance enables observations and applications based on Veselago lensing and other electron-optic phenomena.

Materials and Methods

Raman scattering and photoluminescence. A WITec system inside Ar environment glovebox has automatic mapping with a 532 nm laser, 1 μm spot size and 1800 g/mm grating is used in this experiment. The laser power is 300 μW, the integration time is 25 s and the step size is 0.3 μm for all Raman maps. Due to additional disorder, the CVD graphene signal was weaker and thus 300 s integration time was employed. The EuS and EuS/$RuCl_3$ measurement are performed with 100 μW with 300 s integration time.

Device fabrication and transport. Devices were fabricated using a dry van der Waals stacking technique to sequentially pick up and stack layers of graphene, hexagonal boron nitride, α-$RuCl_3$, and $CrCl_3$, using either poly(bisphenol a) carbonate (PC) or polypropylene carbonate (PPC) films as the adhesive layer. $CrCl_3$ flakes were only exposed to a $N_2$ atmosphere, with the rest assembled in air. Cr/Au top gate and edge contacts were patterned by standard e-beam lithography. Transport measurements were carried out in a Quantum Design Physical Properties Measurement System (PPMS).

Material Growth. Single crystals of α-$RuCl_3$ were grown using a vapor transport technique from phase pure commercial α-$RuCl_3$ powder. Single crystals of $CrCl_3$ are grown by recrystallizing $CrCl_3$ powder in an evacuated quartz tube with temperature gradient 650-550° C. for one week. EuS (10 nm) was deposited at room-temperature at $10^{-8}$ torr, on freshly cleaved $RuCl_3$ surface, using an e-beam evaporation technique. Monolayer CVD graphene was grown on a copper foil via low pressure CVD (as described herein elsewhere).

Peak fitting. To accurately represent the phonon frequencies and amplitudes, the Raman spectra was fit with the Voigt function $$I(\omega, \sigma, \Gamma, A) = \int_{-\infty}^{\infty} G(\omega', \sigma) L(\omega - \omega', \Gamma, A) d\omega'$$

which is a convolution of a Gaussian and a Lorentzian. Here the Lorentzian represents a phonon mode and a Gaussian was used to account for the instrumental resolution. The Gaussian width $\sigma$=1 $cm^{-1}$ is determined by the central Rayleigh peak. $\Gamma$ is the phonon width and A is phonon amplitude.

For the mlg G peak spectra, a fit range of 1550-1650 $cm^{-1}$ was chosen, using a constant background and three-Voigt peaks to capture the broad background that appears in this energy range from the $\alpha$-$RuCl_3$ itself, as well as the presence of both shifted and unshifted G-peaks. For the mlg and blg 2D peak spectra, fit was from 2650-2750 $cm^{-1}$, with a constant background and two-Voigt peaks, for both the shifted and unshifted 2D peaks. For the blg 2D peak, four-Voigt peaks with a constant background were used to capture the four characteristic blg 2D peaks (1A, 1B, 2A, 2B). Raman shift distributions were plotted against 2D1A peak, and this peak was used to calculate blg carrier density, as this peak follows the same trend as the mlg 2D peak.

Determination of strain and doping from Raman. Raman phonon frequencies in graphene are sensitive to both doping and strain. However, these two effects can be separated via correlation decoupling analysis of the G and 2D frequencies. According to FIG. 1C & FIG. 4A, this analysis was used to calculate the doping level in the mono and bilayer graphene of heterostructures described herein. The G and 2D peak frequencies for free standing graphene were denoted as: $(\omega^0_G, \omega^0_{2D})$=(1581.6±0.2 $cm^{-1}$, 2676.9±0.7 $cm^{-1}$) and the frequency shifts from these intrinsic values by $(\Delta\omega_G, \Delta\omega_{2D})$. It is well established that the degree of shift due to doping and strain is different for the graphene G and 2D peaks. From electronic gating measurements and theoretical calculations, the effect of hole doping on the graphene G and 2D peak frequency is quasi-linear with a relationship: $(\Delta\omega^{doping}G/\Delta\omega^{doping}{}_{2D})=\tan(\theta_1)=0.75$ (The red arrow line in FIG. 5A and doping line in FIG. 1C and FIG. 4A). Exfoliated graphene always shows uniaxial strain on the G and 2D frequencies, which follow $(\Delta\omega^{strain}G/\Delta\omega^{strain}{}_{2D})=\tan(\theta_2)$=2.2 (strain line in FIG. 5A, FIGS. 1C and 4A). Next $(\omega^0_G, \omega^0_{2D})$ was used to set the intercept of the strain and doping lines in the $(\omega_G, \omega_{2D})$ space. Thus the shifts in the G and 2D peaks are determined by (see FIG. 5(A-C)):

$$l_D * \sin(\theta 1) + l_s * \sin(\theta 2) = \Delta\omega_{2D}$$
$$l_D * \cos(\theta 1) + l_s * \cos(\theta 2) = \Delta\omega_{2G}$$

By inverting this equation, the measure $(\Delta\omega_G, \omega_{2D})$ can determine the strain and Fermi level. A downward (upward) projected vector along the strain line FIG. 5A, FIGS. 1C & 4A)+ corresponds to tensile (compressive) strain, while along the doping line the vector is always projected to the upward direction for both n and p type doping.

Figure 5A:
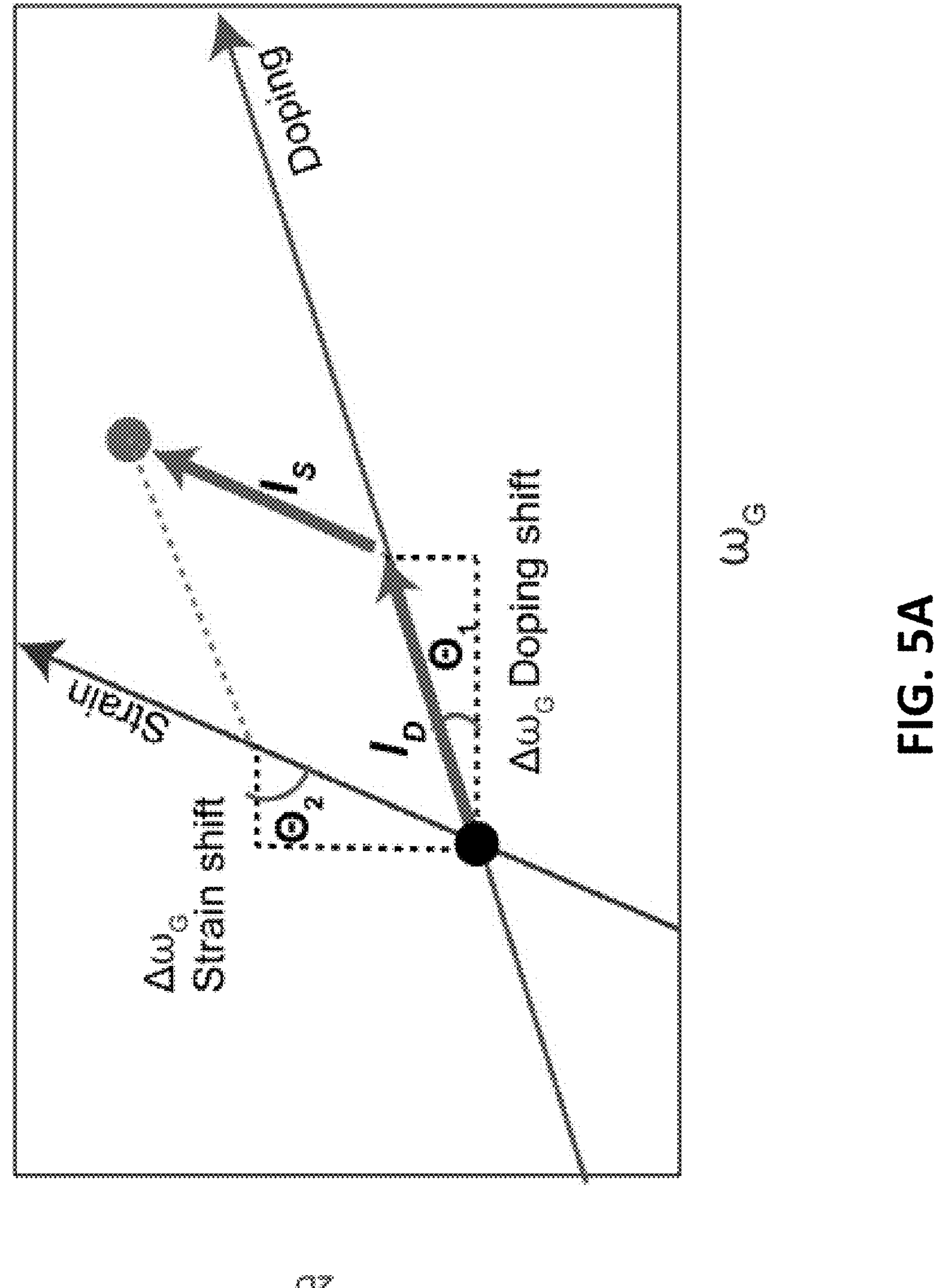
FIG. 5A shows correlation analysis of 2D and G frequencies to separate the frequency shifts from strain and doping.
Figures 5B, 5C:
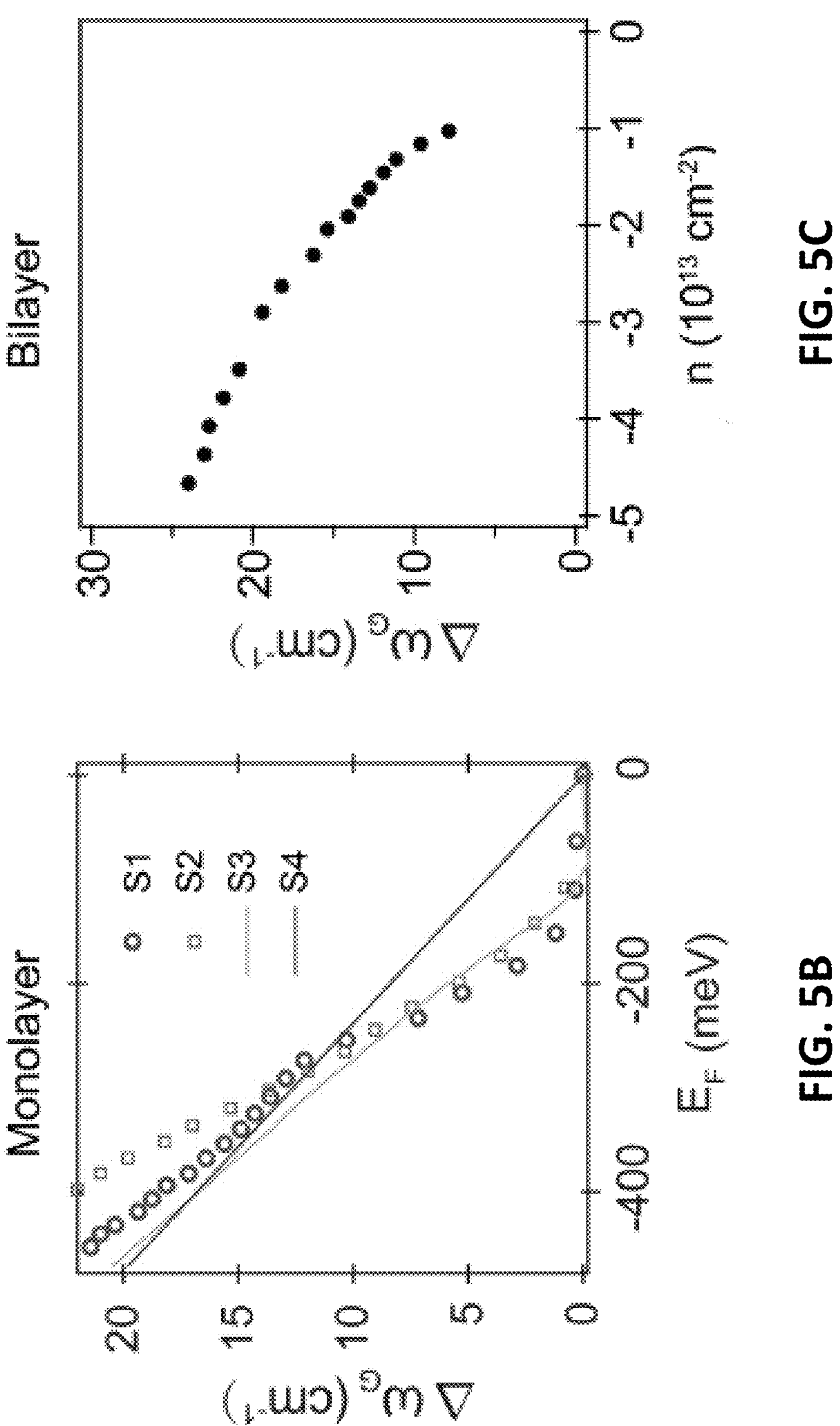
FIG. 5B shows reference data for converting Raman G and 2D peak shifts in monolayer graphene to Fermi energy shifts.
FIG. 5C shows reference data for converting Raman G and 2D peak shifts in bilayer graphene to doping level.

To determine the precise doping level, the results of three independent measurements and a theory calculation shown in FIG. 5B were employed. Specifically, the increase of $\Delta\omega_G$ is proportional to the shift of Fermi level in the high charge carrier limit (EF>100 meV). Using a linear fit to the $\omega_G$ $V_S$ $E_F$, the Fermi energy can then be extracted at each shifted G peak frequency (FIG. 5A).

$$E_F = \Delta\omega_G^{puredoping}/\alpha$$
$$= l_D * \sin(\theta_1)/\alpha$$

Here, $\alpha$ is the linear fitting of $\Delta\omega_G$ and $E_F$ for mlg. From the average of four reference electric gating studies, $\alpha$=−45.7 eV/$cm^{-1}$. Therefore, after converting $E_F$ to carrier density the expression below was used to get the carrier densities of monolayer graphene. As for strain, it also linearly depends on the G peak frequency shift.

$$p = \frac{1}{\pi} \frac{E_F^2}{\hbar * v_F}$$
$$= \frac{1}{\pi}\left(\frac{\sin(\theta 1)}{\alpha * \hbar * v_F}\right)^2 * l_D^2$$
$$\epsilon = \Delta\,\omega_G^{purestrain}/S$$
$$= \frac{\sin(\theta 2)}{s} * l_s$$

Here, $v_F$ is the Fermi velocity, s is the percent of strain. For uniaxial strain s is −23.5 $cm^{-1}$/% and for biaxial strains is −69.1 $cm^{-1}$/%.

In the bilayer graphene case, the carrier density to G peak shift relationship is slightly different from monolayer graphene. To convert Raman peak shifts in bilayer graphene to doping levels, the peak shift values were projected along the doping axis, as with monolayer graphene, then utilized reference results (see FIG. 5C) to convert the G peak shift to hole doping level.

Theory DFT. The DFT calculations are performed within the generalized gradient approximation (GGA) using Perdew-Burke-Ernzerhof (PBE) functional implemented in Vienna Ab initio Simulation Package (VASP).12 A plane-wave basis set with a kinetic energy cutoff of 450 eV, and a 4×3×1 k-point sampling grid is adopted to a heterostructure supercell with cell constant of 12.03 Å. The geometric structure of heterostructures are relaxed by fixing hBN and graphene layers to the $\alpha$-$RuCl_3$ lattice constant (6.02 Å) with fully relaxed force of $\alpha$-$RuCl_3$. This relaxation scheme better mimics the band alignment and charge transfer since the work function of graphene is not sensitive to strain and the strain effect on the wide gap of hBN is small. The proper super cell of $\alpha$-$RuCl_3$ (2×2×1) and for hBN (5×4×1) and graphene (5×4×1) are used to reduce the stress induced by the lattice mismatch between materials while balancing the computational burden. The vacuum distance is set to be around 18 Å along the z-direction to avoid spurious interactions. The vdW interaction is included by the DFT-D2 method and spin orbit coupling (SOC) is always considered. The choice of Hubbard U=2.4 eV and Hund J=0.4 V for $Ru^{3+}$ ions is based on previous studies.

Theory: MINT. The ab initio MINT calculations were carried out within the total-energy plane wave density-functional pseudopotential approach, using Perdew-Burke-Ernzerhof generalized gradient approximation functionals and optimized norm-conserving Vanderbilt pseudopotentials in the SG15 family. Plane wave basis sets with energy cutoffs of Hartree were used to expand the electronic wave functions. Fully periodic boundary conditions and a single unit cell of $\alpha$-$RuCl_3$ with a 6×4×1 k-point mesh were used to sample the Brillouin zone. Electronic minimizations were carried out using the analytically continued functional approach starting with an LCAO initial guess within the DFT++ formalism, as implemented in the open-source code JDFT×20 using direct minimization via the conjugate gradients algorithm. All unit cells were constructed to be inversion symmetric about z=0 with a distance of ≈60 Bohr between periodic images of the $\alpha$-$RuCl_3$ surface, using Coulomb truncation to prevent image interaction.

Figures 6A, 6B, 6C, 6D:
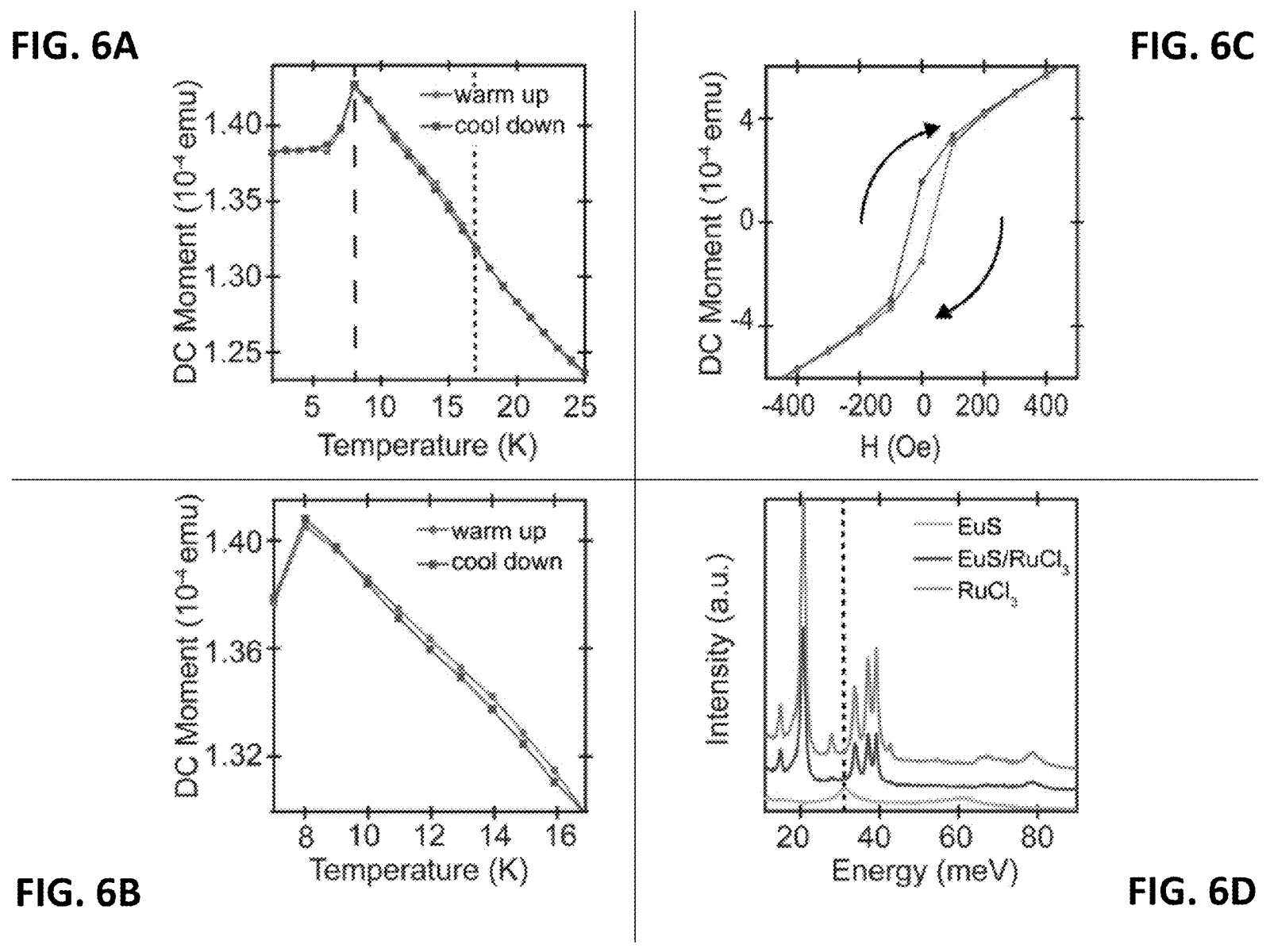

Evidence for charge transfer in MBE grown EuS. EuS is a magnetic semiconductor with a low work function (3.3 eV) than is routinely used in various spintronic and proximity heterostructures. It has a ferromagnet transition temperature of 13K. A 10 nm EuS film grown atop of bulk $\alpha$-$RuCl_3$ ensured both components were intact by SQUID measurements. As shown in FIG. 6A and FIG. 6B the ferromagnetic transition was observed for the heterostructure at the $T_e$ of EuS (13 K). Furthermore the bulk antiferromagnetic transition of $\alpha$-$RuCl_3$ is also seen at 8K. The hysteresis loop at 2K in FIG. 6C further confirms the quality of EuS/$RuCl_3$ heterostructure. To determine if charge transfer occurred, Raman spectroscopy was utilized to ensure no effects of fabrication. Indeed, bare EuS has easily measurable room temperature Raman response at 30.4 meV and the second and third harmonic peaks at 60.8 and 91.2 meV. However, this response becomes suppressed when EuS is significantly doped by charge transfer that removes the real optical transition by Pauli blocking.

Consistent with $\alpha$-$RuCl_3$ significantly doping EuS, the Raman results in (FIG. 6D) show only the EuS phonons at 30.4 meV and 60.8 meV when grown on sapphire, whereas the EuS/$RuCl_3$ heterostructure only shows the $\alpha$-$RuCl_3$ phonons. This provides the evidence that EuS is doped by $\alpha$-$RuCl_3$ and shifts the Fermi level down to where the laser cannot excite electrons to the conduction band (greater than 2.33 eV). This was further confirmed by attaching leads via Ag epoxy and found the room temperature resistivity of EuS/$RuCl_3$ heterostructure is $\rho=4.5\times10^{-6}\Omega$ cm, which is four orders of magnitude smaller than bulk EuS resistance $\rho=1.9\times10^{-2}\Omega$ cm. It was noted that bulk $\alpha$-$RuCl_3$ of similar thickness revealed a resistance three orders of magnitude larger than the heterostructure. This evidence for large charge transfer is consistent with ab initio "mismatched interface theory" (MINT) calculations that predict an induced hole density of $6.5\times10^{13}$ $cm^{-2}$ in EuS.

Figure 7B:
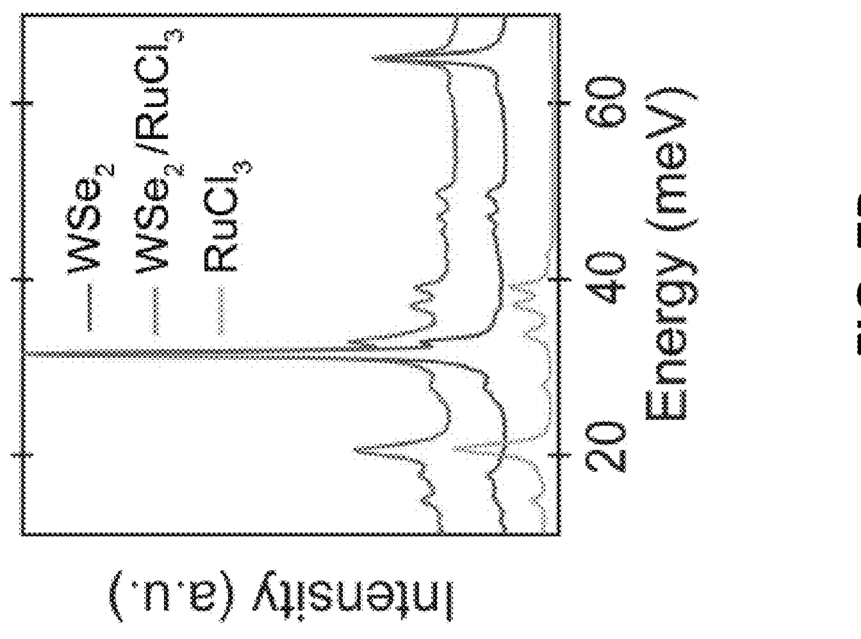
FIG. 7B shows room temperature Raman spectra of $WSe_2$, α-$RuCl_3$ and $WSe_2$/$RuCl_3$.
Figure 7A:
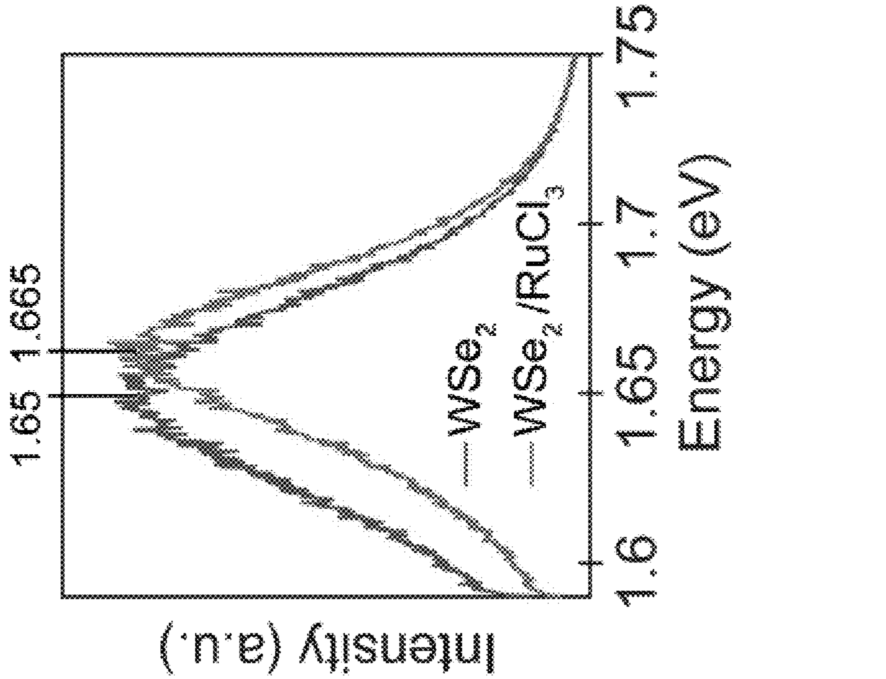
FIG. 7A shows room temperature PL of pure $WSe_2$ and $WSe_2$/$RuCl_3$.

Evidence for charge transfer into CVD grown $WSe_2$. Monolayer $WSe_2$ has a direct band gap and strong exciton binding energy. As the relatively sharp photoluminescence (PL) emission can be sensitive to the chemical potential. In particular for neutral $WSe_2$ the exciton is observed, whereas when doped it forms trions. Thus the exciton emission can be used to detect the carrier type (doping level) and density in monolayer $WSe_2$. To investigate this, a CVD grown and transferred $\alpha$-$RuCl_3$ flake was employed on top. The PL from the bare $WSe_2$ peaks at 1.65 eV, where the region covered by $\alpha$-$RuCl_3$ has significantly narrowed and shifts to 1.665 eV (FIG. 7A). This is consistent with previous reports where n-type or intrinsic $WSe_2$ has a weaker and lower energy PL emission, while hole-bound trions in p-type $WSe_2$ have stronger and blue-shifted emission lines. To exclude the possibility of that the redshift results from strain, Raman spectra were used to check the phonons in the $WSe_2$/$RuCl_3$ heterostructure. As shown in (FIG. 7B), the phonon frequencies of $WSe_2$/$RuCl_3$ heterostructure can overlap with either $\alpha$-$RuCl_3$ or $WSe_2$. This indicates that the strain can be negligible and cannot result in the PL shift. All of the above points to $\alpha$-$RuCl_3$ accepting electrons from the $WSe_2$.

Figure 8:
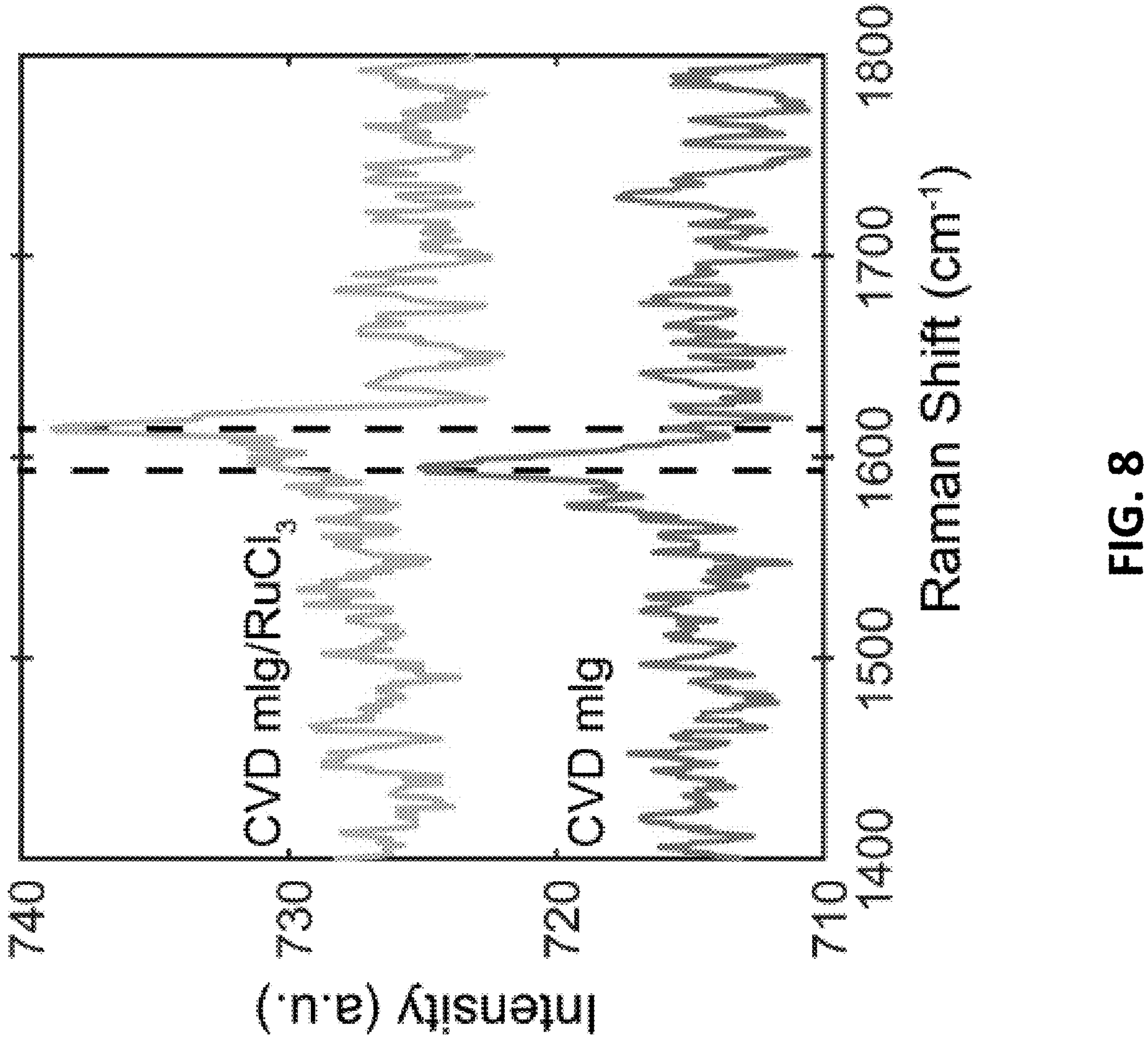
FIG. 8 is an exemplary embodiment of a Raman spectra comparison of CVD graphene (blue line) and CVD graphene/$RuCl_3$ heterostructure (yellow line) in accordance with the present disclosure. A shift of the G peak consistent with entirely exfoliated (or flaked) structures indicates CVD graphene can be equally well charged by α-$RuCl_3$.

Charge transfer into CVD graphene. The charge transfer between $\alpha$-$RuCl_3$ and graphene also can be realized in CVD graphene/$RuCl_3$ heterostructures, crucial for eventual scale-up. To demonstrate this, thin $\alpha$-$RuCl_3$ flakes were gently exfoliated on top of a CVD graphene film on $SiO_2$/Si substrate (as described herein elsewhere). As shown in FIG. 8, the Raman from the CVD graphene revealed a G peak frequency lower than 1590 $cm^{-1}$, but when moving the laser to the region with the CVD graphene/$RuCl_3$ heterostructure the peak shifts to 1617 $cm^{-1}$. Thus it is clear that similar doping levels can be achieved in CVD graphene films. However due to the transfer process this CD graphene was more disordered, resulting in lower overall Raman signals.

Figure 9B:
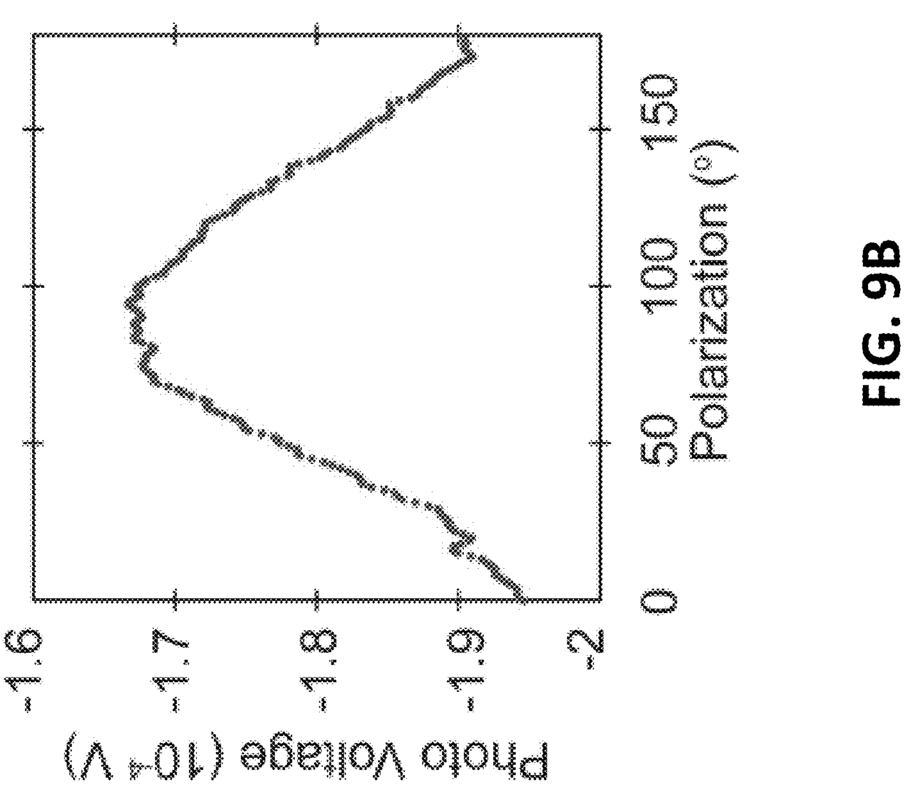
FIG. 9B shows a polarization dependent photovoltage measurement of mlg/$RuCl_3$ FIG. 10(A-D) is an exemplary embodiment of electronic transport in accordance with the present disclosure.
Figure 9A:
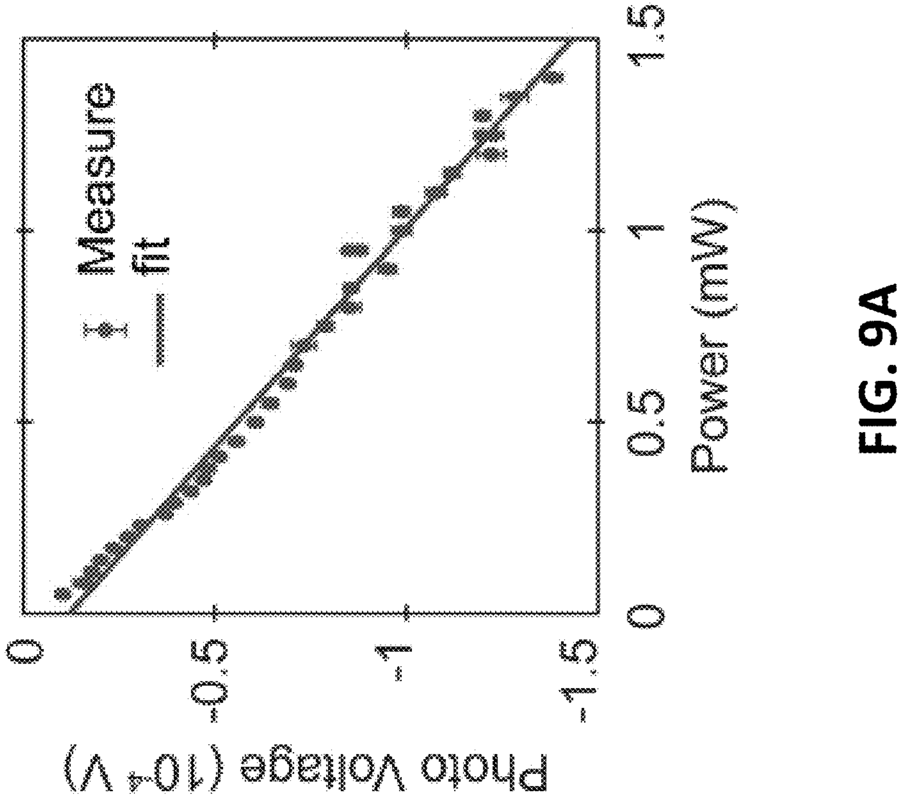
FIG. 9A shows a dependent photovoltage measurement of mlg/$RuCl_3$.

Optoelectronic response of graphene/$\alpha$-$RuCl_3$ heterostructures. Graphene can exhibit both photothermal and photovoltaic responses. The former is driven by electron temperature gradient and the latter is generated by built-in electric fields. Both can be enhanced at high carrier densities but suppressed at the charge neutral point. As such the photovoltage can be useful in detecting charge in homogeneity and the presence of homojunctions in graphene. As shown in FIG. 2F (bottom), the region of the device under the $\alpha$-$RuCl_3$ reveals a strong photovoltage at the interface which is insensitive to gate voltage. This is consistent with a photovoltaic effect resulting from the strong p-p' junction. Whereas the bare graphene reveals some signal due to inhomogeneous doping, which can be neutralized by the gate. Further confirmation that the signal from the edge of the $\alpha$-$RuCl_3$ region is due to the photovoltaic effect is the power dependence. Namely, as shown in (FIG. 9A), the response to power is strictly linear. In addition, the fact that this results from a built-in field is further supported by the polarization dependence seen in (FIG. 9B). Specifically the response is maximized for light polarized along the direction normal to the edge of the $\alpha$-$RuCl_3$ which is parallel to the built-in field from the charge inhomogeneity in the graphene.

Figures 10A, 10B, 10C, 10D:
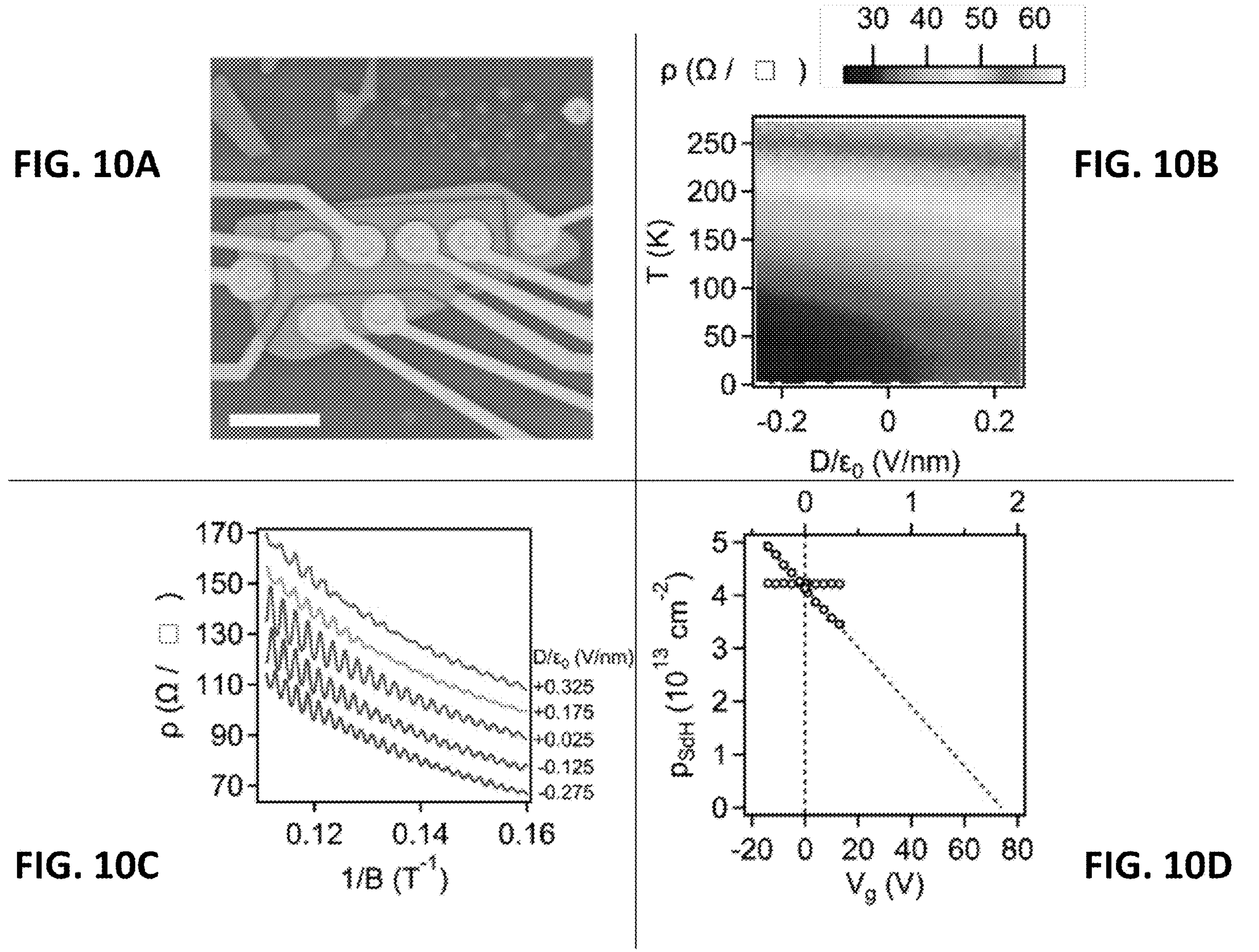
FIG. 10A shows an optical micrograph of device D5.
FIG. 10B shows a map of gate voltage and temperature dependence of the resistivity of D5.
FIG. 10C shows SdH oscillations at various displacement fields.
FIG. 10D shows carrier densities extracted from SdH oscillations. The two unique frequencies found in each SdH trace reveal two populations of holes (black & blue circles) from gated and ungated regions in device, respectively, but both reveal that the graphene is highly doped by the α-$RuCl_3$.

Electronic transport. FIG. 10A shows an optical micrograph of device D5, whose conductivity at T=10 K is described herein. This device features four interior contacts used to extract the zero-field resistivity, which is shown in (FIG. 10B) as a function of temperature and displacement field D. As in the conductivity linecut from FIG. 3E, the resistivity shows no sign of a Dirac peak, and increases monotonically with D indicating the graphene is highly hole doped by the adjacent $\alpha$-$RuCl_3$. Magnetoresistance measurements reveal high frequency Shubnikov-de Haas oscillations (SdH) from a large population of holes (FIG. 10C). Beating is observed in the SdH traces, from which two frequencies were extracted, BF, via a Fourier transform (FIG. 10D). Each frequency corresponds to a carrier density $p=gBF/\varphi0$ where g=4 counts the spin and valley degeneracies in graphene and $\varphi0$ is the magnetic flux quantum. The resulting densities are plotted vs the applied gate voltage, and reveal one population of holes that disperses with D (black circles) and a second that is independent of $V_g$ (blue circles). The two densities are equal at D=0. The non-dispersing contribution was attributed to ungated regions of the graphene that exist around the electrical contacts, which still contribute to the magnetoresistance but where the Fermi energy does not change with D. This leaves a single population of holes that respond to the gate voltage, indicating that in a clean sample, the $\alpha$-$RuCl_3$ strongly and uniformly hole dopes the graphene.

Figure 11:
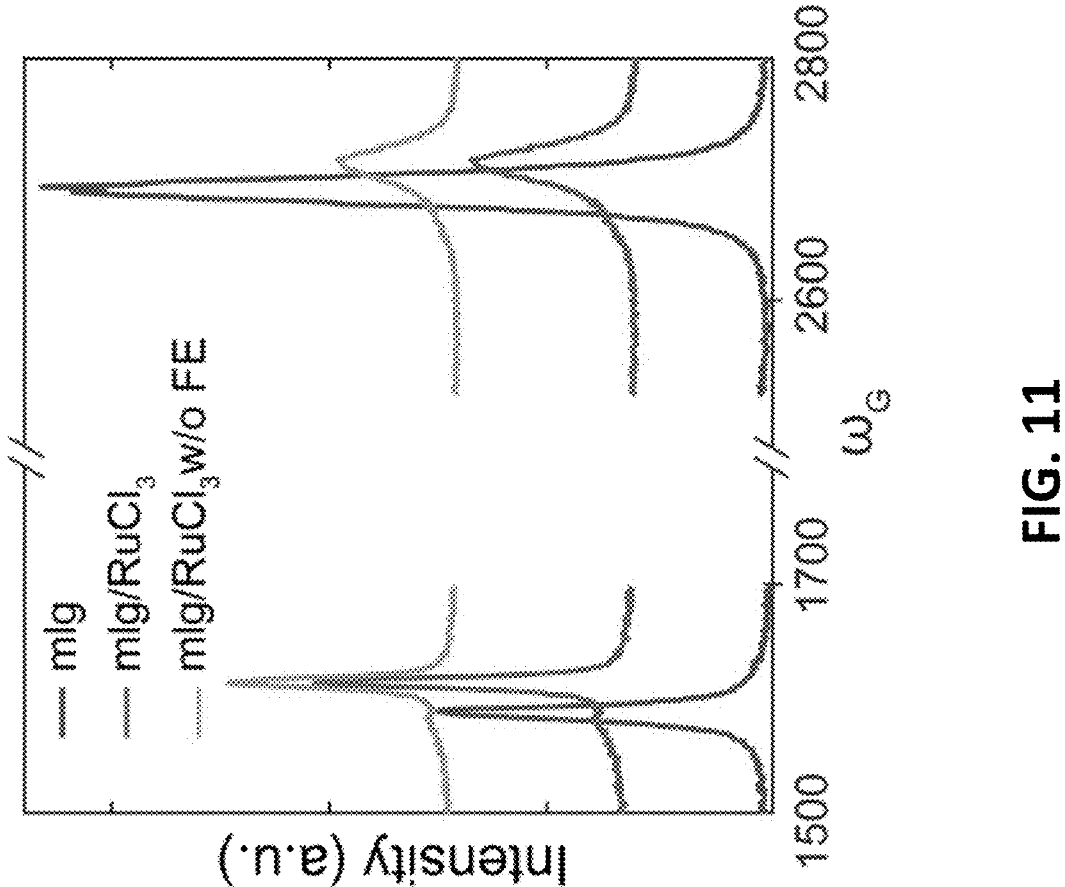
FIG. 11 is an exemplary embodiment of optical correction in accordance with the present disclosure. A comparison of the measured Raman from mlg on $SiO_2$ (blue) with graphene on thin α-$RuCl_3$. After dividing by the interference factor of enhancement (FE) due to the presence of α-$RuCl_3$ (yellow), the G and 2D peaks do not shift their positions.

Interference correction. Raman scattering can be enhanced or suppressed by the interference from thin layers in the heterostructure. The change in the Raman response from interference can be calculated by applying Fresnel's Law to the thin films and summing up the contribution of different layers. As described herein, hole doping in graphene is detected via graphene G peak shift. Thus, the wavenumber dependent enhancement contribution from $\alpha$-$RuCl_3$ to graphene layer becomes important. Here, via dividing the mlg/$RuCl_3$ response with the enhancement factor from $\alpha$-$RuCl_3$, one can get the not-enhanced spectrum (FIG. 11). It is very different to the G peak response of pure mlg on $SiO_2$/Si substrate. This indicates that the G and 2D peak shifts in the heterostructure region is not caused by the stacking layers enhancement. Furthermore, the peak positions of the G and 2D peaks is not influenced by the interreference.

Figure 12:
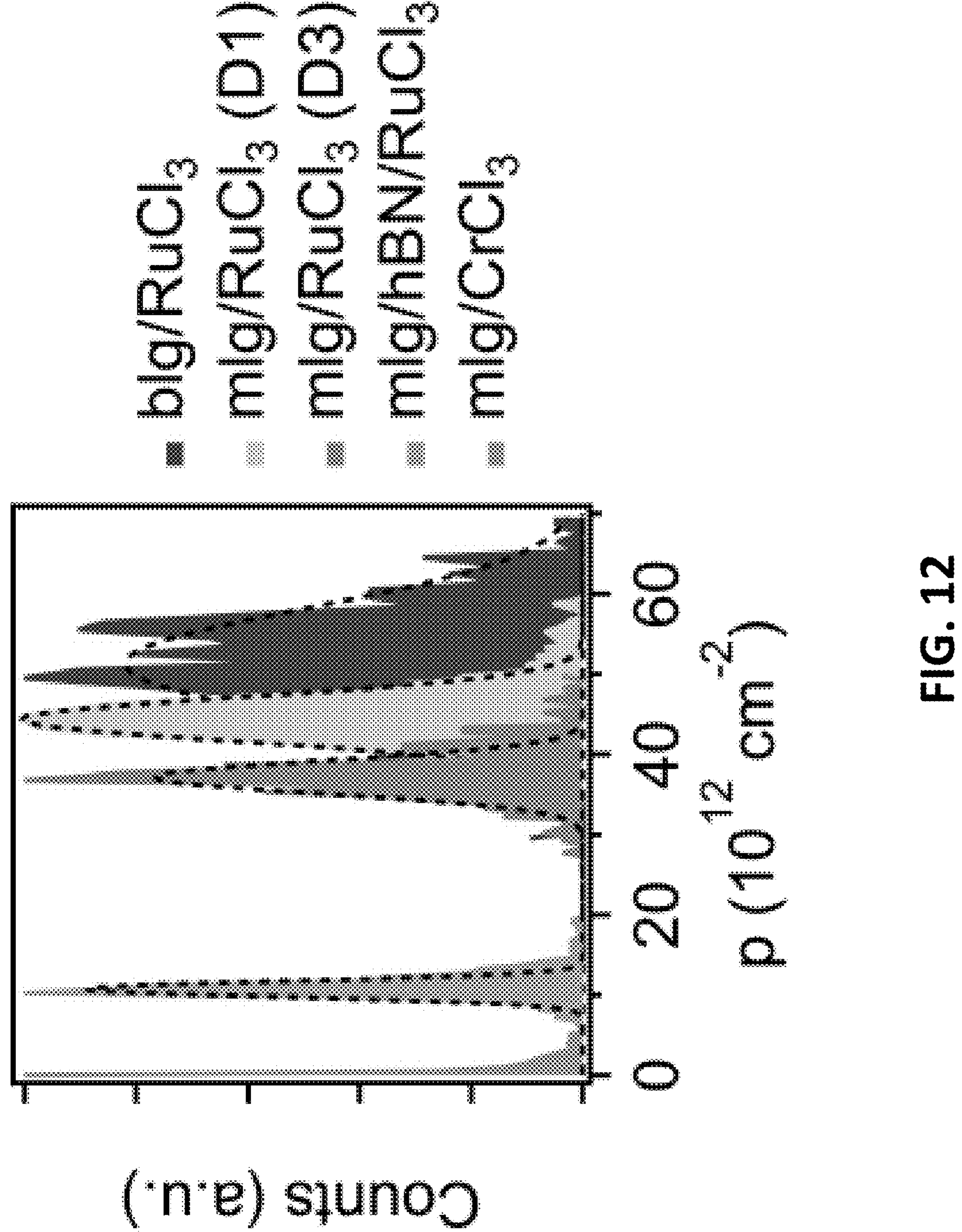
FIG. 12 is an exemplary embodiment of doping distributions in accordance with the present disclosure. Histogram of doping distributions from scanning Raman maps. Black dashed lines represent Gaussian fits.

Range of doping in graphene/$\alpha$-$RuCl_3$ heterostructures. A crucial aspect of the heterostructures presented is the overall uniformity. One measure presented is the presence of neutral puddles inside doped regions. A second is the range of resulting doped values. To access the range of induced dopings, for each device a histogram was made of the local doping level at each point in the Raman maps. These are shown in (FIG. 12) for devices described herein. In general, the distribution of induced carrier densities was found to be well described by lorentzians whose half width at half maximum varies by $\delta p \approx 1\text{-}5\times10^{12}$ $cm^{-2}$. The width for the hBN spaced region was found to be substantially smaller (i.e. more homogenous).

Doping spatial resolution. In the homogeneity map (FIG. 3C), the heterostructure region was mapped out and 95% homogeneity was found (FIG. 3D). Step size is d=300 nm, the step radius is r=150 nm. Therefore, each step covers region A=π*r2=70685.8 $nm^2$. In each step, 5% area is inhomogeneous, which means the inhomogeneity region is A0=5%*A. The inhomogeneous region results from the charge transfer spatial range. The short range charge transfer resolution was then calculated:

$$d_0 \text{ from } A_0, \text{ where } d_0 = 2 * \sqrt{A_0/\pi} = 67 \text{ nm}$$

CVD Growth and Fabrication. The copper foil (Alfa Aesar) was pre-treated in Ni etchant (Transene) to remove any coatings or oxide layers from its surface. The tube furnace was evacuated to a read pressure of 200 mTorr with a constant flow of H2 (10 sccm). Prior to growth, the foil was annealed at 1010° C. (ramp rate 25° C./min) for 35 min. Growth was done at 1010° C. with 68 sccm of H2 and 3.5 sccm of CH4 for 15 min. CVD graphene was removed from its copper film by applying a polymethyl methacrylate (PMMA) adhesion layer, followed by removal of the copper with Ni etchant for 2 h at 60° C. The remaining PMMA/graphene structure was washed in water twice for 60 s, and after transfer to Si/$SiO_2$ the PMMA was dissolved in acetone vapors followed by isopropanol alcohol (IPA) and baked at 300° C. for 8 h in vacuum prior to stacking $\alpha$-$RuCl_3$ on top.

Sample preparation and device fabrication. Graphene, hexagonal boron nitride (hBN), and $\alpha$-$RuCl_3$ flakes were isolated via mechanical exfoliation. Atomic force microscopy was used to con rm the thickness of the flakes used in each device. Devices D1, D2, D3, and D4 were fabricated using a dry van der Waals stacking technique to pick up and stack layers of graphene, hBN, and $\alpha$-$RuCl_3$ using an adhesive layer of polypropylene carbonate (PPC) in D1 and poly(bisphenol a) carbonate (PC) in D2, D3, and D4. The aluminum oxide layer in D1 was grown by electron beam evaporation of 1.5 nm of aluminum that was subsequently oxidized. The top gates and contacts used were patterned by electron beam lithography in D1 and photolithography in D2. Contacts and top gates were metallized by thermal evaporation of Cr/Au leads. Devices were etched using $XeF_2$ gas at a chamber pressure of 1500 mTorr for 15 s.

Electronic transport measurements. Electronic transport, including Hall data, in devices D1 and D2 were taken at 4 K in a variable-temperature cryostat using standard low-frequency measurement techniques.

Scanning tunneling measurements. Completed devices were annealed in UHV at 400° C. for several hours before being transferred into the STM chamber. The STM measurements were conducted in a Createc LT-STM with a vacuum better than $1\times10^{-10}$ mbar at 4.8 K. Electrochemically etched tungsten tips used in the experiments were calibrated by measuring the surface state of Au(111) crystal before all measurements. dI=d$V_S$ spectra were acquired with standard locking technique by applying a 704 Hz ac modulation to the sample bias, with a setpoint of I=1 nA and a 10 mV excitation. Topographic data was acquired with a setpoint current of I=10-20 pA and a 10 mV ac excitation. The STM topography images were plotted with WS×M.

Density functional theory calculations. DFT structural relaxations of the interface were performed with the projector augmented wave method using the Vienna ab initio simulation package (VASP), using the generalized gradient approximation (GGA) for the exchange-correlation functional. A correction due to van der Waals forces are included through the DFT-D2 scheme of Grimme. The lattice parameter a is chosen in such a way that the graphene layer is not strained (i.e., C—C bond-length remains 1.42 Å after relaxation). A plane-wave cutoff of 600 eV is used for all the geometries with k-point sampling of 1×3×1. For all geometrical optimizations, Ru atoms are considered to be in ferromagnetic configuration. In order to calculate the amount of charge transfer between the layers, Bader analysis of wavefunctions was used obtained from VASP calculations. Correlation effects and spin-orbit coupling in this heterostructure system are not expected to affect the value of the charge transfer as observed in the commensurate bilayer case.

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that vary depending upon the desired properties sought to be obtained by a particular embodiment. In some embodiments, the numerical parameters are be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein.

In some embodiments, the terms "a" and "an" and "the" and similar references used in the context of describing a particular embodiment (especially in the context of certain of the following claims) are construed to cover both the singular and the plural, unless specifically noted otherwise. In some embodiments, the term "or" as used herein, including the claims, is used to mean "and/or" unless explicitly indicated to refer to alternatives only or to refer to the alternatives that are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and may also cover other unlisted steps. Similarly, any composition or device that "comprises," "has" or "includes" one or more features is not limited to possessing only those one or more features and may cover other unlisted features.

All methods described herein are performed in any suitable order unless otherwise indicated herein or otherwise clearly contradicted by context. The use of any and all examples, or exemplary language (e.g. "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member is referred to and claimed individually or in any combination with other members of the group or other elements found herein. One or more members of a group are included in, or deleted from, a group for reasons of convenience or patentability. When any such inclusion or deletion occurs, the specification is herein deemed to contain the group as modified thus fulfilling the written description of all Markush groups used in the appended claims.

To facilitate the understanding of the embodiments described herein, a number of terms are defined below. The terms defined herein have meanings as commonly understood by a person of ordinary skill in the areas relevant to the present disclosure. Terms such as "a," "an," and "the" are not intended to refer to only a singular entity, but rather include the general class of which a specific example may be used for illustration. The terminology herein is used to describe specific embodiments of the disclosure, but their usage does not delimit the disclosure, except as outlined in the claims.

All of the compositions and/or methods disclosed and claimed herein may be made and/or executed without undue experimentation in light of the present disclosure. While the compositions and methods of this disclosure have been described in terms of the embodiments included herein, it will be apparent to those of ordinary skill in the art that variations may be applied to the compositions and/or methods and in the steps or in the sequence of steps of the method described herein without departing from the concept, spirit, and scope of the disclosure. All such similar substitutes and modifications apparent to those skilled in the art are deemed to be within the spirit, scope, and concept of the disclosure as defined by the appended claims.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A charge-transfer controlled 2D device comprising:

a 2D active conducting material;

a 2D charge transfer source material; and at least one overlapping portion wherein the 2D active conducting material overlaps the 2D charge transfer source material including at least one edge of the 2D charge transfer source material;

wherein:

at least a part of the at least one overlapping portion comprises the 2D active conducting material being in direct contact with the 2D charge transfer source material;

the charge-transfer controlled 2D device further comprises an insulating layer such that the at least a part of the at least one overlapping portion comprises the insulating layer disposed between the 2D active conducting material and the 2D charge transfer source material, wherein the insulating layer is selected from hexagonal boron nitride and $AlO_x$;

the 2D charge transfer source material comprises at least one of a crystalline material and an exfoliated material; and the 2D charge transfer source material is selected from alpha-$RuCl_3$ and tungsten oxyselenide.

2. The device of claim 1, wherein the 2D active conducting material is selected from graphene, $WSe_2$, and EuS.

3. The device of claim 1, wherein the at least one edge of the 2D charge transfer source material is a straight cleaved edge.

4. A method for controlling charge transfer in 2D materials, the method comprising:

providing a 2D active conducting material;

providing a 2D charge transfer source material; and positioning the 2D active conducting material to overlap at least one portion of the 2D charge transfer source material including at least one edge of the 2D charge transfer source material;

wherein:

the positioning comprises overlapping at least a part of the 2D active conducting material in direct contact with the 2D charge transfer source material;

the method further comprises providing an insulating layer on a surface of the 2D charge transfer source material, and wherein the positioning comprises overlapping the at least a part of the 2D active conducting material in direct contact with the insulating layer on the surface of the 2D charge transfer source material, wherein the insulating layer is selected from hexagonal boron nitride and $AlO_x$;

the 2D charge transfer source material comprises at least one of a crystalline material and an exfoliated material; and the 2D charge transfer source material is selected from alpha-$RuCl_3$ and tungsten oxyselenide.

5. The method of claim 4, wherein the 2D active conducting material is selected from graphene, $WSe_2$, and EuS.

6. The method of claim 4, wherein the at least one edge of the 2D charge transfer source material is a straight cleaved edge.

7. A charge-transfer controlled 2D system comprising:

a top gate;

a charge-transfer controlled 2D device including a 2D active conducting material, a 2D charge transfer source material, and at least one overlapping portion wherein the 2D active conducting material overlaps the 2D charge transfer source material including at least one edge of the 2D charge transfer source material, wherein:

at least a part of the at least one overlapping portion comprises the 2D active conducting material being in direct contact with the 2D charge transfer source material;

the charge-transfer controlled 2D device further comprises an insulating layer such that the at least a part of the at least one overlapping portion comprises the insulating layer disposed between the 2D active conducting material and the 2D charge transfer source material, wherein the insulating layer is selected from hexagonal boron nitride and $AlO_x$;

the 2D charge transfer source material comprises at least one of a crystalline material and an exfoliated material; and the 2D charge transfer source material is selected from alpha-$RuCl_3$ and tungsten oxyselenide; and a bottom gate.

8. The system of claim 7, wherein:

the top gate is selected from Cr/Au and hexagonal boron nitride-supported Cr/Au;

the 2D active conducting material is selected from graphene, $WSe_2$, and EuS;

the 2D charge transfer source material is crystalline, exfoliated alpha-$RuCl_3$; and the bottom gate comprises $SiO_2$/p-Si.

* * * * *